US010734196B2

(12) United States Patent
Morii et al.

(10) Patent No.: US 10,734,196 B2
(45) Date of Patent: Aug. 4, 2020

(54) IMPEDANCE MATCHING DEVICE

(71) Applicant: DAIHEN Corporation, Osaka-shi, Osaka (JP)

(72) Inventors: Tatsuya Morii, Osaka (JP); Masayuki Nakahama, Osaka (JP)

(73) Assignee: DAIHEN Corporation, Osaka-shi, Osaka (JP)

( * ) Notice: Subject to any disclaimer, the term of this patent is extended or adjusted under 35 U.S.C. 154(b) by 0 days.

(21) Appl. No.: 16/333,381

(22) PCT Filed: Sep. 25, 2017

(86) PCT No.: PCT/JP2017/034565
§ 371 (c)(1),
(2) Date: Mar. 14, 2019

(87) PCT Pub. No.: WO2018/062109
PCT Pub. Date: Apr. 5, 2018

(65) Prior Publication Data
US 2019/0214232 A1 Jul. 11, 2019

(30) Foreign Application Priority Data
Sep. 29, 2016 (JP) .................. 2016-191513

(51) Int. Cl.
*H01J 37/32* (2006.01)
*H03H 7/40* (2006.01)
(Continued)

(52) U.S. Cl.
CPC ......... *H01J 37/32183* (2013.01); *H01G 5/16* (2013.01); *H01J 37/32091* (2013.01);
(Continued)

(58) Field of Classification Search
CPC .......... H01J 37/32183; H01J 37/32091; H01G 5/16; H03H 7/38; H03H 7/40; H03H 7/54; H05H 1/46; H05H 2001/4682
See application file for complete search history.

(56) References Cited
U.S. PATENT DOCUMENTS 7,251,121 B2   7/2007  Bhutta
7,298,128 B2   11/2007 Bhutta
(Continued)

FOREIGN PATENT DOCUMENTS

JP    S61-199432 A    9/1986
JP    2004-208450 A   7/2004
(Continued)

*Primary Examiner* — Stephen E. Jones
*Assistant Examiner* — Samuel S Outten
(74) *Attorney, Agent, or Firm* — Bret E. Field; Bozicevic, Field & Francis LLP

(57) ABSTRACT

Provided is an impedance matching device for matching an impedance between a high-frequency power source and a load. The impedance matching device pertaining to the present invention is provided with: a matching circuit having variable capacitors, a capacitance of which is adjusted by an ON/OFF operation of a plurality of switches; a switch control unit for performing control for causing states of the switches of the variable capacitors to coincide with a target state in order to adjust the capacitance of the variable capacitors; and a switch state evaluation unit for evaluating whether a switch is in a state requiring suppression of a temperature increase. The switch control unit is configured so that when the switch state evaluation unit evaluates that a switch of the variable capacitors is in a state requiring suppression of a temperature increase, control is performed for suspending changing of a switch state of the switch for a set period and suppressing a temperature increase in the switch.

21 Claims, 13 Drawing Sheets

(51) Int. Cl.
*H05H 1/46* (2006.01)
*H03H 7/54* (2006.01)
*H03H 7/38* (2006.01)
*H01G 5/16* (2006.01)

(52) U.S. Cl.
CPC ............... *H03H 7/38* (2013.01); *H03H 7/40* (2013.01); *H03H 7/54* (2013.01); *H05H 1/46* (2013.01); *H05H 2001/4682* (2013.01)

(56) References Cited

U.S. PATENT DOCUMENTS

| | | | |
|---|---|---|---|
| 9,196,459 | B2 | 11/2015 | Bhutta |
| 9,306,533 | B1 | 4/2016 | Mavretic |
| 9,345,122 | B2 | 5/2016 | Bhutta |
| 9,496,122 | B1 | 11/2016 | Bhutta |
| 9,525,412 | B2 | 12/2016 | Mavretic |
| 9,543,122 | B2 | 1/2017 | Bhutta |
| 9,584,090 | B2 | 2/2017 | Mavretic |
| 9,591,739 | B2 | 3/2017 | Bhutta |
| 9,697,991 | B2 | 7/2017 | Bhutta |
| 9,728,378 | B2 | 8/2017 | Bhutta et al. |
| 9,729,122 | B2 | 8/2017 | Mavretic |
| 9,745,660 | B2 | 8/2017 | Bhutta |
| 9,755,641 | B1 | 9/2017 | Bhutta |
| 9,844,127 | B2 | 12/2017 | Bhutta |
| 10,026,594 | B2 | 7/2018 | Bhutta |
| 10,217,608 | B2 | 2/2019 | Mavretic |
| 10,340,879 | B2 | 7/2019 | Mavretic et al. |
| 10,431,424 | B2 | 10/2019 | Mavretic et al. |
| 10,431,428 | B2 | 10/2019 | Bhutta et al. |
| 10,454,453 | B2 | 10/2019 | Bhutta et al. |
| 10,455,729 | B2 | 10/2019 | Bhutta |
| 10,460,912 | B2 | 10/2019 | Bhutta et al. |
| 10,483,090 | B2 | 11/2019 | Bhutta et al. |
| 2014/0354350 | A1* | 12/2014 | Bowers .................. H03F 3/195 327/564 |
| 2016/0380610 | A1 | 12/2016 | Ulrich |
| 2017/0178865 | A1 | 6/2017 | Ulrich |
| 2019/0172683 | A1 | 6/2019 | Mavretic et al. |
| 2019/0267212 | A1 | 8/2019 | Mavretic |
| 2019/0272978 | A1 | 9/2019 | Ahmed et al. |
| 2019/0326094 | A1 | 10/2019 | Bhutta |

FOREIGN PATENT DOCUMENTS

| | | |
|---|---|---|
| JP | 2009-021785 A | 1/2009 |
| JP | 2010-198524 A | 9/2010 |
| JP | 2012-142285 A | 7/2012 |
| JP | 2014-505983 A | 3/2014 |
| WO | WO2010116897 A1 | 10/2010 |

\* cited by examiner

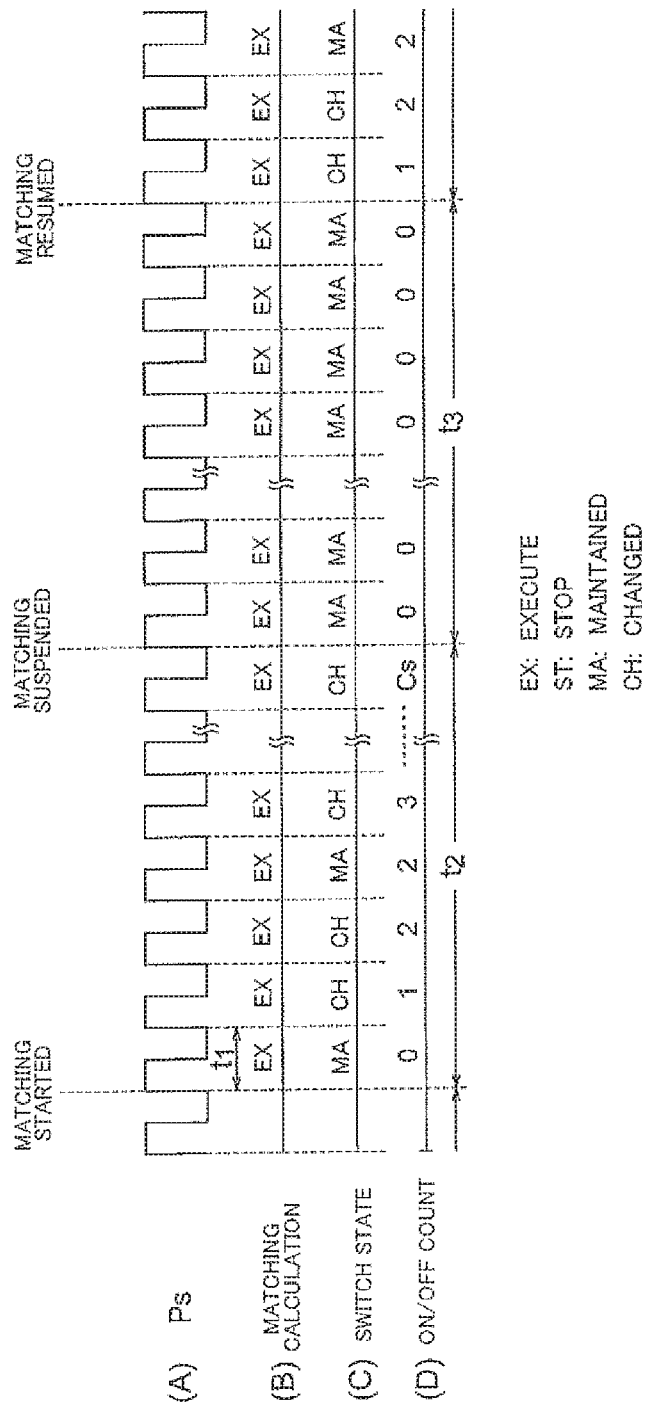

US 10,734,196 B2

IMPEDANCE MATCHING DEVICE

TECHNICAL FIELD

The present invention relates to an impedance matching device whereby impedance can be matched between a high-frequency power source and a load.

BACKGROUND ART

In order to eliminate reflection of electric power from a load and efficiently supply electric power to the load when electric power is supplied from a high-frequency power source to a plasma load or other load, an impedance matching device is provided between the high-frequency power source and the load so that an output impedance of the high-frequency power source and an impedance of a circuit viewed from an output terminal of the high-frequency power source toward the load are matched. In the present specification, the impedance of the circuit viewed from the output terminal of the high-frequency power source toward the load is referred to as a load-side impedance.

This type of impedance matching device, which has been widely used in the past, is provided with a mechanically operated variable capacitor provided with an operating shaft for adjusting a capacitance thereof, an inductor constituting part of a matching circuit along with the variable capacitor, a motor for operating the operating shaft of the variable capacitor, and a control unit for controlling the motor so as to cause a position of the operating shaft of the variable capacitor to coincide with a target position, and impedance matching is performed in the impedance matching device by controlling the position of the operating shaft of the variable capacitor to coincide with a necessary position thereof for achieving impedance matching, as disclosed in Patent Document 1, for example.

However, when a mechanically operated variable capacitor is used, an ability to increase a matching speed is limited, and a problem therefore arises that an ability of a matching operation to follow variations in impedance deteriorates when high-frequency electric power is supplied to a load in which the impedance frequently varies, such as in the case of a plasma load, reflected power increases, and electric power can no longer be efficiently supplied to the load.

An electronically controlled impedance matching device has therefore been proposed in which, instead of a mechanically operated variable capacitor, a variable capacitor is used that is capable of electronic control and that has a structure in which a plurality of capacitance elements are connected in parallel, each of the capacitance elements being constituted from a capacitor and a capacitance adjustment switch comprising a semiconductor element connected in series to the capacitor, and impedance matching can be rapidly performed by changing a state (ON state or OFF state) of at least one of the capacitance adjustment switches provided to the variable capacitor each time a variation in the load-side impedance is detected, as disclosed in Patent Document 2.

PRIOR ART DOCUMENTS

Patent Documents

[Patent Document 1] Japanese Laid-open Patent Application No. 2010-198524
[Patent Document 2] Japanese Laid-open Patent Application No. 2012-142285

DISCLOSURE OF THE INVENTION

Problems to be Solved by the Invention

In the configuration disclosed in Patent Document 2, when a load-side impedance has changed, impedance matching can be achieved by changing a state of at least one of capacitance adjustment switches provided to a variable capacitor and adjusting a capacitance of a variable capacitor to a necessary value for impedance matching. Since a capacitance adjustment switch comprising a semiconductor element can be turned ON and OFF at high speed, the impedance matching device disclosed in Patent Document 2 enables rapid matching of impedance between a high-frequency power source and a load.

When high-frequency electric power is supplied to a load in which the impedance frequently varies, such as in the case of a plasma load, in order to increase the precision of impedance matching in an application of the impedance matching device disclosed in Patent Document 2, a period at which the load-side impedance is sampled must be shortened, and the capacitance of the variable capacitor must be finely adjusted. However, in a case in which an impedance of a load frequently varies, when the sampling period of the load-side impedance is shortened and the capacitance of the variable capacitor of a matching circuit is adjusted each time a variation in the load-side impedance is detected, at least one of the series of capacitance adjustment switches provided to the variable capacitor is then forced to turn ON and OFF at a high frequency. In this case, when the load-side impedance continues to vary, due to increased switching loss in a semiconductor element constituting part of the capacitance adjustment switch that is caused to turn ON and OFF at high frequency, a junction temperature of the semiconductor element increases, and there is a risk of thermal destruction of the capacitance adjustment switch.

In order to avoid this problem, it is possible to lengthen a period at which the load-side impedance is sampled, and to lengthen a period at which a switch state of the capacitance adjustment switch is changed. However, when the period at which the load-side impedance is sampled is lengthened, the capacitance of each variable capacitor of the matching circuit can no longer be adjusted with high precision to follow an actual variation of the load-side impedance, and the matching operation can no longer be made to follow the variation in the load-side impedance, thus leading to an unavoidable decrease in matching precision.

An object of the present invention is to make it possible to reliably protect a capacitance adjustment switch without significantly decreasing a precision of impedance matching when a load-side impedance varies at a high frequency, in an impedance matching device for matching an output impedance of a high-frequency power source and a load-side impedance using a matching circuit that employs an electronically operated variable capacitor in which a capacitance thereof is adjusted by the ON/OFF operation of capacitance adjustment switches comprising semiconductor elements.

Means to Solve the Problems

The present invention is an impedance matching device for matching an output impedance of a high-frequency power source and a load-side impedance, which is an impedance viewed from an output terminal of the high-frequency power source toward a load. In the present invention, in order to achieve the abovementioned object, the impedance matching device comprises: a matching circuit disposed between the high-frequency power source and a load, the matching circuit being provided with at least one variable capacitor having a structure in which a plurality of capacitance elements are connected in parallel, the capacitance elements being constituted from a capacitor and a capacitance adjustment switch connected in series, and the capacitance adjustment switch comprising a semiconductor element; a matching calculation unit for performing, at a set period, a matching calculation for determining, as a target switch state, a state in which the capacitance adjustment switches provided to the matching circuit should take in order for the output impedance of the high-frequency power source and the load-side impedance to be matched; a switch control unit for performing control for causing switch states of the capacitance adjustment switches provided to the matching circuit to coincide with the target switch state; and a switch state evaluation unit for evaluating whether at least one of the capacitance adjustment switches provided to the matching circuit is in a state requiring suppression of a temperature increase; the switch control unit being configured so that when an evaluation is made by the switch state evaluation unit that at least one of the capacitance adjustment switches provided to the matching circuit is in a state requiring suppression of a temperature increase, the at least one capacitance adjustment switch provided to the matching circuit is designated as a protection-object switch, and temperature increase suppression control for suppressing a temperature increase in the protection-object switch by stopping switching operation of the protection-object switch or reducing a frequency with which the protection-object switch performs switching operation is performed for a set temperature increase suppression period.

Through the present invention, it is possible to eliminate heat generation or reduce the amount of heat generated from the protection-object switch for the duration of the temperature increase suppression period and to suppress a temperature increase therein, and appropriate protection of the capacitance adjustment switches can therefore be achieved. For a period other than the temperature increase suppression period, control is also performed for causing a switch state of the series of capacitance adjustment switches provided to the matching circuit to coincide with the target switch state determined by the matching calculation unit, and it is therefore possible to protect the capacitance adjustment switches without significantly decreasing precision of impedance matching between the high-frequency power source and the load.

In an aspect of the present invention, the matching calculation unit is configured so as to sample, at a set sampling period, a parameter that reflects the load-side impedance and to perform the matching calculation each time the parameter is sampled.

In an aspect of the present invention, at least one of the capacitance adjustment switches provided to the matching circuit is designated as a monitoring-object switch, and by monitoring a switch state of the monitoring-object switch, an evaluation is made as to whether at least one of the capacitance adjustment switches provided to the matching circuit is in a state requiring suppression of a temperature increase. In this case, a switch state evaluation means is provided with change frequency evaluation means for evaluating whether a switch state change frequency is equal to or greater than a set evaluation reference value, the switch state change frequency being a number of times that a switch state of the monitoring-object switch is changed from an ON state to an OFF state or from the OFF state to the ON state in a set evaluation reference time, and the switch state evaluation unit is configured so as to evaluate that at least one of the capacitance adjustment switches provided to the matching circuit is in a state requiring suppression of a temperature increase when an evaluation is made by the change frequency evaluation means that the switch state change frequency of the monitoring-object switch is equal to or greater than the evaluation reference value.

In another aspect of the present invention, at least one variable capacitor provided to the matching circuit is designated as a monitoring-object variable capacitor, and at least one capacitance adjustment switch provided to the monitoring-object variable capacitor is designated as the monitoring-object switch.

In another aspect of the present invention, a number of times that the target switch state of the monitoring-object switch is changed by the matching calculation unit in a set evaluation reference time is designated as the switch state change frequency of the monitoring-object switch.

In the above description, the switch state evaluation means is configured so as to evaluate whether at least one of the capacitance adjustment switches provided to the matching circuit is in a state requiring suppression of a temperature increase on the basis of a frequency with which the state of the monitoring-object switch is changed, but the present invention is not limited to such a configuration of the switch state evaluation means.

For example, a configuration may also be adopted in which the switch state evaluation unit is provided with load-side impedance occurrence frequency detection means for detecting, as a load-side impedance variation occurrence frequency, a number of times that a variation greater than or equal to a set size occurs in the load-side impedance in a set evaluation reference time, and load-side impedance variation occurrence frequency evaluation means for evaluating whether the detected load-side impedance variation occurrence frequency is equal to or greater than a set evaluation reference value, and the switch state evaluation unit is configured so as to evaluate that at least one of the capacitance adjustment switches provided to the matching circuit is in a state requiring suppression of a temperature increase when an evaluation is made by the load-side impedance variation occurrence frequency evaluation means that the load-side impedance variation occurrence frequency is equal to or greater than the set evaluation reference value.

The switch state evaluation unit may also be configured so as to evaluate that at least one of the capacitance adjustment switches provided to the matching circuit is in a state requiring suppression of a temperature increase when a temperature that reflects a temperature of the capacitance adjustment switches provided to the matching circuit is equal to or greater than a set evaluation reference value.

In the present invention, the evaluation reference time and the evaluation reference value are not necessarily fixed, and the evaluation reference time and/or the evaluation reference value may also be changed in accordance with the temperature that reflects the temperature of the capacitance adjustment switches, or another appropriate parameter. For example, the evaluation reference value may be made smaller the higher the temperature that reflects the temperature of the capacitance adjustment switches is, and the evaluation reference time may be made shorter the higher the temperature that reflects the temperature of the capacitance adjustment switches is.

The temperature increase suppression period is also not necessarily fixed, and the duration of the temperature increase suppression period may be changed in accordance with a size of a parameter such as the temperature that reflects the temperature of the capacitance adjustment switches. For example, the temperature increase suppression period may be made longer the higher the temperature that reflects the temperature of the capacitance adjustment switches is.

Yet other aspects of the present invention will be made clear in the description given below of the best mode for carrying out the invention.

Advantageous Effects of the Invention

In the present invention, a switch state evaluation unit is provided for evaluating whether at least one of a capacitance adjustment switches provided to a matching circuit is in a state requiring suppression of a temperature increase, at least one of the capacitance adjustment switches provided to the matching circuit is designated as a protection-object switch when an evaluation is made by the evaluation unit that at least one of the capacitance adjustment switches provided in the matching circuit requires suppression of a temperature increase, and temperature increase suppression control for suppressing a temperature increase in the protection-object switch by stopping switching operation of the protection-object switch or reducing a frequency with which the protection-object switch performs switching operation is performed for a set temperature increase suppression period; therefore, it is possible to eliminate heat generation or reduce an amount of heat generated from the protection-object switch for a duration of the temperature increase suppression period and to suppress a temperature increase therein, and appropriate protection of the capacitance adjustment switches can therefore be achieved. For a period other than the temperature increase suppression period, control is also performed for causing a switch state of a series of capacitance adjustment switches provided to the matching circuit to coincide with a target switch state determined by a matching calculation unit, and it is therefore possible to protect the capacitance adjustment switches without significantly decreasing a precision of impedance matching between a high-frequency power source and a load.

BRIEF DESCRIPTION OF THE DRAWINGS

FIG. 13 is another time chart for explaining the operation of an embodiment of the present invention.

BEST MODE FOR CARRYING OUT THE INVENTION

Figure 1:
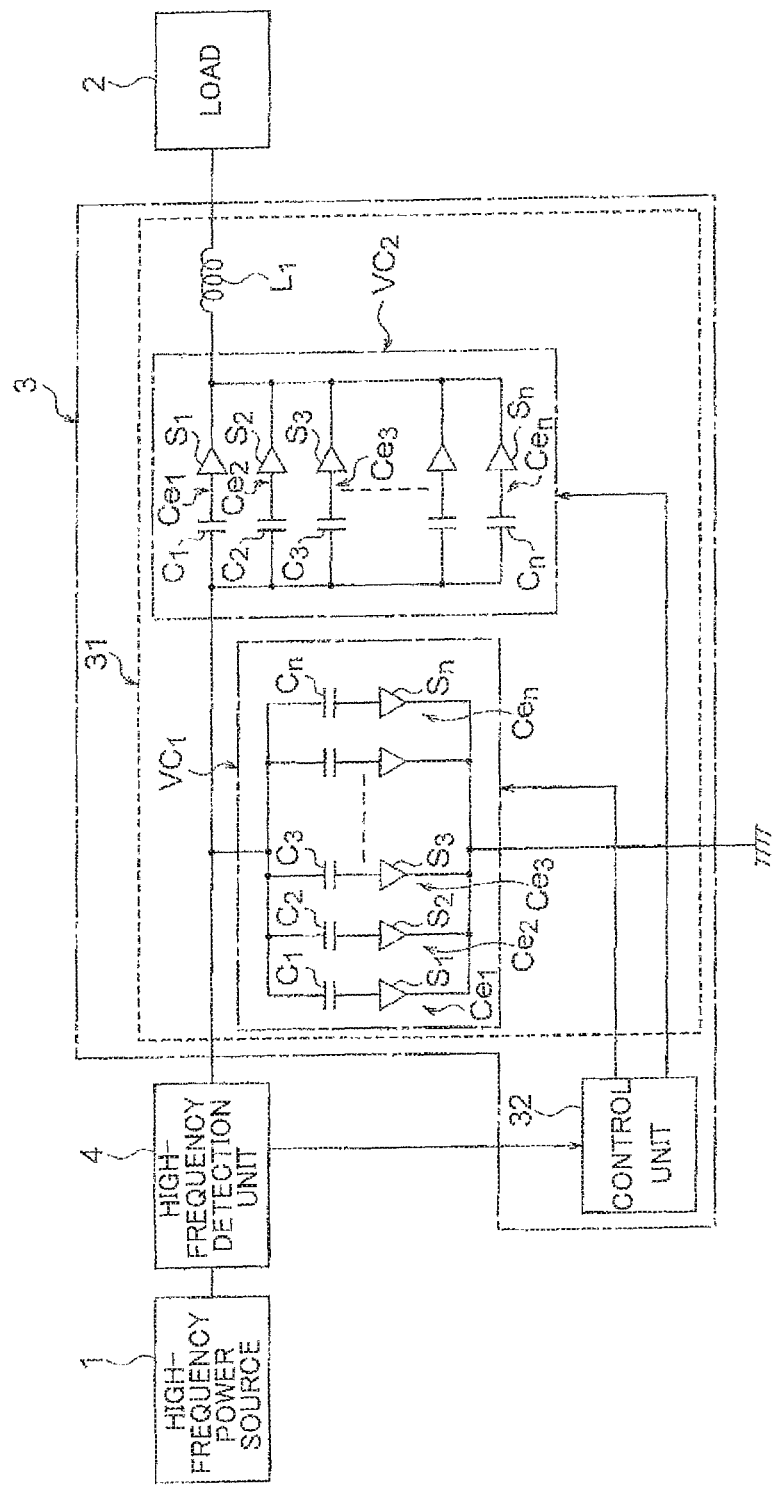
FIG. 1 is a circuit diagram illustrating a circuit structure of an embodiment of an impedance matching device according to the present invention.

Embodiments of an impedance matching device according to the present invention will be described below with reference to the accompanying drawings. FIG. 1 illustrates a circuit configuration of an embodiment of the impedance matching device according to the present invention. In FIG. 1, a reference numeral 1 refers to a high-frequency power source for outputting high-frequency electric power, 2 refers to a load to which high-frequency electric power is supplied from the high-frequency power source 1, 3 refers to an impedance matching device that performs an operation to match a load-side impedance, which is the impedance viewed from an output terminal of the high-frequency power source 1 toward the load, to an output impedance of the high-frequency power source 1, the impedance matching device being provided between the high-frequency power source 1 and the load 2, and 4 refers to a high-frequency detection unit for detecting a parameter used to calculate the impedance viewed from the output terminal of the high-frequency power source 1 toward the load. The structure of each component is described below.

\<High-Frequency Power Source\>

The high-frequency power source 1 is constituted from, for example, a high-frequency signal generating unit for generating a signal having a frequency equal to the frequency of the electric power supplied to the load, and a power amplifier for amplifying an output of the high-frequency signal generating unit.

\<Load\>

In the present embodiment, the load 2 is a plasma load used in a semiconductor processing device or the like. The plasma load is provided with a chamber in which an object to be processed is accommodated, and a plasma generating electrode disposed in the chamber, for example, and when high-frequency electric power is supplied to the plasma generating electrode, a gas in the chamber is ionized and a plasma is generated. The impedance of the plasma load always varies, and the impedance matching device 3 is therefore required to perform impedance matching at high speed.

\<Matching Circuit\>

Various embodiments of a matching circuit 31 according to the present invention are possible, but in the present embodiment, the matching circuit 31 is constituted from: a first variable capacitor VC1, one end of which is connected to a non-ground-side output terminal of the high-frequency power source 1 through the high-frequency detection unit 4 and the other end of which is grounded; a second variable capacitor VC2, one end of which is connected to the one end of the first variable capacitor VC1; and an inductor L1 connected between the load 2 and the other end of the second variable capacitor VC2.

In order to facilitate adjustment of a capacitance of each of the variable capacitors, each of the variable capacitors has a plurality of capacitance elements constituted from a capacitor and a capacitance adjustment switch connected in series, the capacitance adjustment switch comprising a semiconductor element, and each of the variable capacitors is preferably an electronically operated variable capacitor having a structure in which the plurality of capacitance elements are connected to each other in parallel. When variable capacitors having such a structure are used, the capacitance of the variable capacitors can be adjusted, as appropriate, by changing a combination of ON/OFF states of a series of capacitance adjustment switches provided to the plurality of capacitance elements connected to each other in parallel.

Each of the variable capacitors VC1 and VC2 used in the present embodiment has a structure in which first through $n^{th}$ (n being an integer of 2 or greater) capacitance elements Ce1-Cen are connected to each other in parallel, the capacitance elements Ce1-Cen being formed by connecting, in series, first through $n^{th}$ capacitance adjustment switches S1-Sn each comprising a semiconductor element to first through $n^{th}$ capacitors C1-Cn, respectively. When the variable capacitors VC1 and VC2 are constituted in this manner, the capacitance of each variable capacitor becomes equal to a total capacitance value of the capacitors connected in series to the capacitance adjustment switches that are in an ON state. For example, the capacitance of the variable capacitors when the first capacitance adjustment switch S1 and the third capacitance adjustment switch S3 are in the ON state and the other capacitance adjustment switches are in an OFF state is equal to the total value of the capacitance of the capacitor C1 and the capacitance of the capacitor C3.

In the present embodiment, the first through $n^{th}$ capacitance adjustment switches S1-Sn comprise PIN diodes that can be ON/OFF controlled at high speed. Each of the PIN diodes is placed in the OFF state by application of a reverse-directed direct-current voltage between an anode and cathode thereof from a driver circuit not illustrated in the drawings, and is placed in the ON state by application of a constant forward-directed direct-current voltage between the anode and cathode thereof. The PIN diodes are in a low-impedance state (ON state) when a fixed DC current is flowing therethrough in a forward direction. When the PIN diodes are in the ON state, a high-frequency current can flow in both directions through the diodes.

When the variable capacitors are constituted as illustrated in FIG. 1, the capacitance of the variable capacitors VC1 and VC2 can be adjusted in two $n^{th}$-power steps by making the capacitances of the first through $n^{th}$ capacitors C1-Cn dissimilar and appropriately selecting the state (ON state or OFF state) of each of the first through $n^{th}$ capacitance adjustment switches S1-Sn.

In order to facilitate understanding of a relationship between the states of the first through $n^{th}$ capacitance adjustment switches S1-Sn and the capacitances of the variable capacitors VC1 and VC2, when the first through $n^{th}$ first through $n^{th}$ capacitors C1-Cn are made to correspond to first through $n^{th}$ digits, respectively, of an n-bit binary number, the first digit and the $n^{th}$ digit thereof being a least significant digit and a most significant digit, respectively, of the binary number, and the capacitance of the first capacitor C1 as the smallest capacitance among the capacitances of the first through $n^{th}$ first through $n^{th}$ capacitors C1-Cn is designated as Cmin, for example, the capacitances of each of the first through $n^{th}$ capacitors C1-Cn are set so that the capacitance Ck of the $k^{th}$ (k=1 to n) capacitor (the capacitor corresponding to the $k^{th}$ digit from the least significant digit of the binary number) has a value determined by equation (1) below.

$$Ck = Cmin \cdot 2^{k-1} \quad (1)$$

In the above equation, k−1 is a bit number indicating a bit position of the bit of the $k^{th}$ digit from the least significant digit of the binary number to which the $k^{th}$ capacitor corresponds. When the capacitances of the first through $n^{th}$ capacitors are established in a manner described above, $2^n$ capacitances (capacity of a synthetic capacitor of C1-Cn) differing in value by Cmin each can be obtained by changing the combination of states (ON state or OFF state) of the first through $n^{th}$ capacitance adjustment switches S1-Sn.

For example, when n=4, Cmax=1 pF, a first capacitance adjustment switch S1 through fourth capacitance adjustment switch S4 are made to correspond to a first through fourth digits, respectively, of a four-digit binary number, and the capacitances of the capacitors C1 through C4 are set to 1, 2, 4, and 8 [pF], respectively, in accordance with equation (1), a variable capacitor can be obtained in which the capacitance thereof can have $2^4$ (16 in the present example) values (0 to 15 [pF] in the present example) differing by Cmin [pF] (1 [pF] in the present example) each, as shown in Table 1 below.

TABLE 1

| Digit number k | | | | |
|---|---|---|---|---|
| 4 | 3 | 2 | 1 | |
| Capacitor (Electrostatic capacity) | | | | |
| C4 (8) | C3 (4) | C2 (2) | C1 (1) | Synthetic capacitor capacity |
| Switch element | | | | |
| S4 | S3 | S2 | S1 | [pF] |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |

Binary number State of switch elements S1-S4 0: OFF 1: ON

When 10 capacitors are provided (n=10), the capacitance of the first capacitor C1 is set to 1 [pF], and the capacitances of the capacitors C1, C2, and so on are set so as to double in sequence 1 pF, 2 pF, 4 pF, 8 pF, and so on with the capacitance of the $10^{th}$ capacitor being 512 pF, for example, the capacitance of the variable capacitor can be adjusted in 1 pF units from 0 pF to 1023 pF.

In the present embodiment, the state (ON state or OFF state) referred to as the "target switch state" is a state in which the series of capacitance adjustment switches provided to the variable capacitors should take in order for the variable capacitors to have the capacitance that is necessary for matching the impedance between the high-frequency power source and the load. When a relationship between a binary number and the capacitors is established as described above, the target switch state is specified by a binary number having a number of digits equal to the number of capacitance adjustment switches in the series thereof provided to the variable capacitor.

For example, the variable capacitors are constituted from four capacitance elements, first through fourth capacitance adjustment switches S1-S4 are provided to the variable capacitors, the first capacitance adjustment switch S1 through fourth capacitance adjustment switch S4 are made to correspond to the first through fourth digits, respectively, of a four-digit binary number, and the four-digit binary number and the capacitances of the variable capacitors are related according to the relationship illustrated in Table 1. In this case, the target capacitance of the variable capacitor VC1 that is needed so that the impedance viewed from the output terminal of the high-frequency power source 1 toward the load is matched to the output impedance of the high-frequency power source 1 is 10 pF, and the target capacitance of the variable capacitor VC2 is 5 pF. In this case, the target switch state to be assumed by the fourth capacitance adjustment switch S4, the third capacitance adjustment switch S3, the second capacitance adjustment switch S2, and the first capacitance adjustment switch S1 of the variable capacitor VC1 is specified by the four-digit binary number "1010," and the target switch state to be assumed by the fourth capacitance adjustment switch S4, the third capacitance adjustment switch S3, the second capacitance adjustment switch S2, and the first capacitance adjustment switch S1 of the variable capacitor VC2 is specified by the four-digit binary number "0101."

<High-Frequency Detection Unit>

The high-frequency detection unit 4 illustrated in FIG. 1 is a component for detecting a parameter used to calculate the load-side impedance. A high-frequency voltage and high-frequency current supplied from the high-frequency power source 1 to the load 2, and a phase difference between the high-frequency voltage and high-frequency current, for example, may be used as parameters that reflect the load-side impedance, and traveling-wave power and reflected-wave power detected at an output end of the high-frequency power source 1 may also be used. The high-frequency detection unit 4 is provided with a directional coupler or the like and is configured so as to be able to detect the above parameters. In the present embodiment, the high-frequency voltage and high-frequency current presented to the load 2 from the high-frequency power source 1, and the phase difference between the high-frequency voltage and high-frequency current, are detected from the high-frequency detection unit 4 as parameters that reflect the load-side impedance.

<Control Unit>

Figure 2:
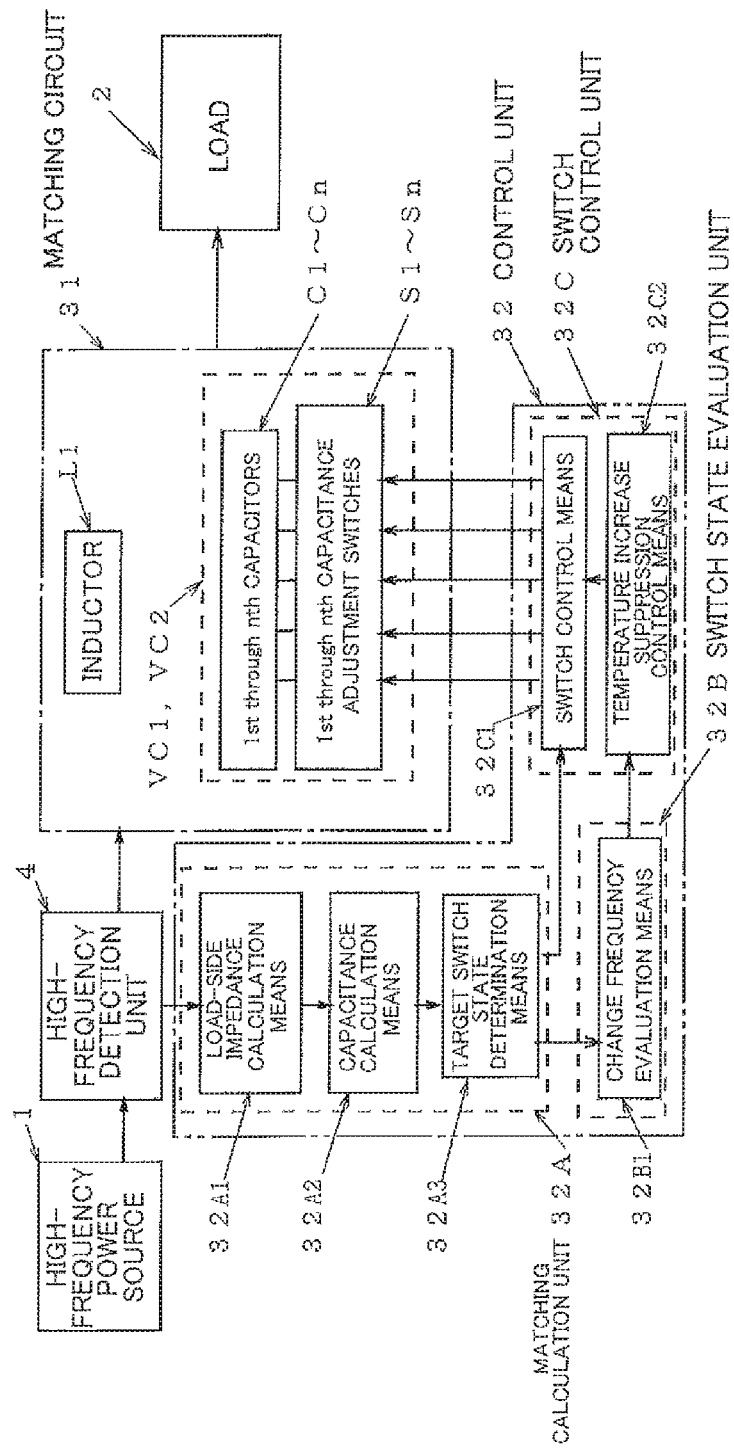
FIG. 2 is a block diagram illustrating an example configuration of a control unit used in an embodiment of the present invention.

An example of a configuration of a control unit 32 used in the present embodiment is illustrated in FIG. 2. The control unit 32 illustrated in FIG. 2 is constituted from a matching calculation unit 32A, a switch state evaluation unit 32B, and a switch control unit 32C. Although not shown in FIG. 2, the control unit 32 is provided with a pulse generator for generating a sample pulse Ps at a fixed sampling period t1, as illustrated in FIG. 12(A). A structure of the matching calculation unit 32A, the switch state evaluation unit 32B, and the switch control unit 32C constituting the control unit 32 will be described below.

<Matching Calculation Unit>

The matching calculation unit 32A illustrated in FIG. 2 is a component for performing, at a set period, a matching calculation for determining, as the target switch state, a state in which the capacitance adjustment switches provided to the matching circuit 31 should be set so as to match together the output impedance of the high-frequency power source 1 and the impedance of the circuit (load-side impedance) viewed from the output terminal of the high-frequency power source toward the load 2. In the present embodiment, a parameter that reflects the load-side impedance is sampled at a sampling period set from the high-frequency detection unit 4, and the matching calculation unit 32A is configured so as to perform the matching calculation each time the parameter is sampled.

A high-frequency voltage and high-frequency current supplied from the high-frequency power source 1 to the load 2, and the phase difference between the high-frequency voltage and high-frequency current, for example, may be used as parameters that reflect the impedance viewed from the output terminal of the high-frequency power source toward the load. A traveling-wave power and reflected-wave power detected at the output end of the high-frequency power source, or a reflection coefficient of the reflected-wave power, may also be used as the abovementioned parameter.

In the present embodiment, the matching calculation unit 32A is constituted from a load-side impedance calculation means 32A1, a capacitance calculation means 32A2, and a target switch state determination means 32A3. In the load-side impedance calculation means 32A1, the parameter reflecting the load-side impedance is sampled from the high-frequency detection unit 4 each time that a pulse generator (not illustrated in the drawings) generates a sample pulse Ps (see FIG. 12(A)) at the fixed period t1, and the load-side impedance is calculated each time the parameter is sampled.

The capacitance calculation means 32A2 is a means for calculating the capacitance that each of the variable capacitors VC1 and VC2 of the matching circuit 31 should have in order to match the load-side impedance calculated by the load-side impedance calculation means 32A1 to the output impedance of the high-frequency power source 1.

The target switch state determination means 32A3 is a means for determining, as the target switch state of the first through $n^{th}$ capacitance adjustment switches S1-Sn connected in series to the first through $n^{th}$ capacitors C1-Cn, respectively, constituting the variable capacitor VC1, the state (ON/OFF state) in which the capacitance adjustment switches S1-Sn of the variable capacitor VC1 should take in order to make the capacitance of the variable capacitor VC1 equal to (or infinitely close to) the capacitance calculated by the capacitance calculation means 32A2, and determining, as the target switch state of the first through $n^{th}$ capacitance adjustment switches S1-Sn connected in series to the first through $n^{th}$ capacitors C1-Cn, respectively, constituting the variable capacitor VC2, the state in which the capacitance adjustment switches S1-Sn of the variable capacitor VC2 should take in order to set the capacitance of the variable capacitor VC2 to the capacitance calculated by the capacitance calculation means 32A2.

<Switch State Evaluation Unit>

The switch state evaluation unit 32B is a means for evaluating whether at least one of the capacitance adjustment switches provided to the matching circuit 31 is in a state requiring suppression of a temperature increase. A state requiring suppression of a temperature increase in a capacitance adjustment switch is defined as a state in which a temperature of a junction of a semiconductor element constituting the capacitance adjustment switch exceeds an allowable limit and there is a risk of destruction of the capacitance adjustment switch if ON/OFF operation of the switch state of the capacitance adjustment switch is continued in that temperature condition.

In the present embodiment, at least one of the capacitance adjustment switches S1-Sn provided to the variable capacitor VC1 and the capacitance adjustment switches S1-Sn provided to the variable capacitor VC2 is designated as a monitoring-object switch, and the switch state evaluation unit 32B is configured so as to evaluate whether at least one monitoring-object switch is in a state requiring suppression of a temperature increase.

The evaluation as to whether a capacitance adjustment switch is in a state requiring suppression of a temperature increase can be performed by monitoring a parameter that is correlated with the temperature of a junction of a semiconductor element constituting the capacitance adjustment switch. Consequently, the switch state evaluation unit 32B monitors a parameter that is correlated with the temperature of a junction of a monitoring-object switch, and can be configured so as to evaluate whether at least one monitoring-object switch is in a state requiring suppression of a temperature increase on the basis of the parameter.

The frequency with which the load-side impedance varies by a set value or greater, the frequency with which the switch state of a capacitance adjustment switch is changed, a temperature of a specific portion reflecting a temperature of a capacitance adjustment switch provided to the matching circuit, or another parameters, for example, can be used as a parameter that is correlated with the temperature of a junction of a capacitance adjustment switch. A temperature of a substrate on which a capacitance adjustment switch is mounted, a temperature of a semiconductor element package constituting a capacitance adjustment switch, or a temperature of a heat sink devised to dissipate heat from a capacitance adjustment switch, for example, can be used as a temperature that reflects the temperature of a capacitance adjustment switch provided to the matching circuit.

In the embodiment illustrated in FIG. 2, the frequency (switch state change frequency) with which the switch state of a capacitance adjustment switch is changed from the ON state to the OFF state or from the OFF state to the ON state is used as the parameter that is correlated with the temperature of a junction of the capacitance adjustment switch.

The switch state evaluation unit 32B illustrated in FIG. 2 is provided with a change frequency evaluation means 32B1 for evaluating whether the switch state change frequency of a monitoring-object switch is equal to or greater than a set evaluation reference value, the monitoring-object switch being at least one of the capacitance adjustment switches provided to the matching circuit, and the switch state change frequency being the frequency with which the switch state of the monitoring-object switch is changed from the ON state to the OFF state or from the OFF state to the ON state, and the switch state evaluation unit 32B is configured so that when the change frequency evaluation means 32B1 determines that the switch state change frequency of at least one monitoring-object switch is equal to or greater than the evaluation reference value, the switch state evaluation unit 32B determines that at least one of the capacitance adjustment switches provided to the matching circuit 31 is in a state requiring suppression of a temperature increase.

In the present embodiment, the switch state change frequency of the monitoring-object switch is a number of times that the switch state of the monitoring-object switch is changed in a set evaluation reference time. The number of times that the switch state of the monitoring-object switch is changed in the evaluation reference time can be detected by counting the number of times that the switch state of the monitoring-object switch is actually changed in the set evaluation reference time, or by counting the number of times that the matching calculation unit 32A changes the target switch state of the monitoring-object switch in the set evaluation reference time.

The "evaluation reference time" used when determining the switch state change frequency of a capacitance adjustment switch and the "evaluation reference value" used when evaluating whether a capacitance adjustment switch is in a state requiring suppression of a temperature increase can be determined by conducting an experiment in which an impedance matching operation is performed while the parameters are changed in various ways, and a temperature of the capacitance adjustment switch is measured.

In the above description, the monitoring-object switch is at least one of all of the capacitance adjustment switches provided to the matching circuit 31, but a configuration may also be adopted in which at least one of the variable capacitors provided to the matching circuit 31 is selected as a "monitoring-object variable capacitor," and at least one capacitance adjustment switch provided to the monitoring-object variable capacitor is designated as the monitoring-object switch.

Specifically, the change frequency evaluation means 32B1 can be configured so that at least one of the variable capacitors provided to the matching circuit 31 is designated as a monitoring-object variable capacitor, and at least one of the capacitance adjustment switches provided to the monitoring-object variable capacitor is designated as the monitoring-object switch. In this case as well, the switch state evaluation unit 32B is configured so that when the change frequency evaluation means determines that the switch state change frequency of at least one monitoring-object switch is equal to or greater than the evaluation reference value, the switch state evaluation unit 32B determines that at least one of the capacitance adjustment switches provided to the matching circuit is in a state requiring suppression of a temperature increase.

<Monitoring-Object Variable Capacitor and Monitoring-Object Switch>

When a plurality of variable capacitors are provided to the matching circuit in the impedance matching device, it is not always the case that frequent adjustments are made to the capacitances of all the variable capacitors when the load-side impedance changes, and it is sometimes the case that frequent adjustments are made to the capacitances of only some of the variable capacitors.

Moreover, the frequency with which the switch state is changed is not the same for each of the plurality of capacitance adjustment switches provided to the variable capacitors, and the switch state change frequency of a capacitance adjustment switch whose switch state is changed (turned ON or OFF) during adjustment of the value of lower-order digit of the capacitance of a variable capacitor is greater than the switch state change frequency of a capacitance adjustment switch whose switch state is changed during adjustment of the numerical value of a higher-order digit of the capacitance of a variable capacitor.

When it is known that there is a difference in the frequency with which the capacitances of the plurality of variable capacitors provided to the matching circuit are adjusted, there is no need to use the capacitance adjustment switches provided to all the variable capacitors as monitoring-objects; a configuration may be adopted in which the variable capacitor having the higher frequency of capacitance adjustment is used as the monitoring-object variable capacitor, and the switch state change frequency of the capacitance adjustment switches provided to the monitoring-object variable capacitor are monitored.

Likewise, when it is known that there is a difference in switch state change frequency among the plurality of capacitance adjustment switches provided to the monitoring-object variable capacitor, there is no need to use all the capacitance adjustment switches provided to the monitoring-object variable capacitor as monitoring-object switches; a configuration may be adopted in which only a capacitance adjustment switch that is known to have a high switch state change frequency is used as a monitoring-object switch.

By adopting a configuration in which the switch state change frequency of the capacitance adjustment switch that is most prone to require rapid protection is monitored, and temperature increase suppression control is performed for the capacitance adjustment switch selected as a protection-object switch when the switch state change frequency thereof is equal to or greater than the evaluation reference value, it is possible to achieve reliable protection of the capacitance adjustment switches constituting the matching circuit. By monitoring the switch state change frequency of only some of the capacitance adjustment switches provided to the matching circuit, it is possible to simplify the processing for detecting the switch state change frequency and evaluating whether the switch state change frequency is equal to or greater than the set evaluation reference.

The switch state change frequency of a capacitance adjustment switch can also be detected by providing the capacitance adjustment switch with a switch state detection means for detecting whether the capacitance adjustment switch is in the ON state or the OFF state and counting the number of times that a change in the switch state of the capacitance adjustment switch is detected by the switch state detection means in a set evaluation reference time; however, when the switch state change frequency is detected by such a method, a switch state detection means need only be provided to a portion of the capacitance adjustment switches used as monitoring-object switches when only some of the capacitance adjustment switches are used as monitoring-object switches, and a structure of the matching circuit can therefore be prevented from becoming complex.

Even when at least one variable capacitor provided to the matching circuit 31 is designated as a monitoring-object variable capacitor and at least one of the capacitance adjustment switches provided to the monitoring-object variable capacitor is designated as a monitoring-object switch, it remains the case that at least one of the capacitance adjustment switches provided to the matching circuit 31 is designated as a monitoring-object switch.

In the present invention, the switch state evaluation unit 32B is not precluded from being configured so that all of the variable capacitors provided to the matching circuit 31 are designated as monitoring-object variable capacitors, all of the capacitance adjustment switches provided to the variable capacitors, or at least one capacitance adjustment switch that is known to have a high switch state change frequency from among the capacitance adjustment switches provided to the variable capacitors is designated as a monitoring-object switch, and an evaluation is made that at least one capacitance adjustment switch provided to the matching circuit is in a state requiring suppression of a temperature increase when the switch state change frequency of at least one monitoring-object switch is evaluated as being equal to or greater than the evaluation reference value.

<Structure of the Switch State Evaluation Unit Used in the Present Embodiment>

As described above, it is possible to designate only some of the capacitance adjustment switches provided to the matching circuit 31 as monitoring-object switches in the present invention, but in the following description, the two variable capacitors VC1 and VC2 provided to the matching circuit 31 are both designated as monitoring-object variable capacitors, all of the capacitance adjustment switches S1-Sn provided to the monitoring-object variable capacitors are designated as monitoring-object switches, and the switch state change frequency of the monitoring-object switches is determined by counting the number of times that the matching calculation unit 32A changes the target switch state of the capacitance adjustment switches S1-Sn in the set evaluation reference time.

As described above, the matching calculation unit 32A used in the present embodiment is configured so that the first through $n^{th}$ digits of an n-bit binary number, the first digit and $n^{th}$ digit thereof being, respectively, the least significant digit and the most significant digit thereof, are made to correspond respectively to the first through $n^{th}$ capacitors C1-Cn, and the target switch state to be attained by the first through $n^{th}$ capacitance adjustment switches is indicated by whether each of the first through $n^{th}$ digits of the n-bit binary number are 1 or 0.

In the present embodiment, noting that the n-bit binary number shows a combination pattern of switch states of the first through $n^{th}$ capacitance adjustment switches S1-Sn, the switch state evaluation unit 32B is configured so as to evaluate that at least one of the capacitance adjustment switches provided to the matching circuit 31 is in a state requiring suppression of a temperature increase when the number of times that the n-bit binary number changes in the set evaluation reference time is equal to or greater than the evaluation reference value.

<Switch Control Unit>

The switch control unit 32C is constituted from a switch control means 32C1 for controlling the ON/OFF state of the capacitance adjustment switches provided to the matching circuit, and a temperature increase suppression control means 32C2 for controlling temperature increase suppression. Here, the switch control means 32C1 is a means for controlling the ON/OFF state of the first through $n^{th}$ capacitance adjustment switches S1-Sn of the variable capacitors, and in a steady state, the switch control means 32C1 controls the first through $n^{th}$ capacitance adjustment switches S1-Sn of the variable capacitors so as to cause the states of the capacitance adjustment switches to coincide with the target switch state determined by the matching calculation unit 32A.

The temperature increase suppression control means 32C2 is a means for issuing a temperature increase suppression control execution command to the switch control means 32C1, designating at least one of the capacitance adjustment switches S1-Sn provided to the matching circuit 31 as a protection-object switch, and causing the switch control means 32C1 to perform control (temperature increase suppression control) for suppressing a temperature increase in the protection-object switch for a set temperature increase suppression period when an evaluation is made by the switch state evaluation unit 32B that at least one of the series of capacitance adjustment switches S1-Sn provided to the matching circuit 31 is in a state requiring suppression of a temperature increase. When only some of the series of capacitance adjustment switches S1-Sn provided to the matching circuit 31 are designated as protection-object switches, the switch control means 32C1 performs temperature increase suppression control for the protection-object switches when the temperature increase suppression control execution command is issued from the temperature increase suppression control means, but for capacitance adjustment switches other than the protection-object switches, the switch control means 32C1 performs switch control for causing the switch states thereof to coincide with the target switch state.

<Temperature Increase Suppression Control>

Temperature increase suppression control is performed by stopping the switching operation of the protection-object switch or by reducing the frequency of switching operation in the protection-object switch. When temperature increase suppression control is performed by stopping the switching operation of the protection-object switch, the switching operation of the protection-object switch can be stopped by stopping calculation of the target switch state by the matching calculation unit 32A for the temperature increase suppression period, or by fixing the switch state of the protection-object switch at the state thereof immediately prior to the start of temperature increase suppression control.

To perform temperature increase suppression control by reducing the frequency of switching operation by the protection-object switch, for example, rather than changing the switch state of the protection-object switch each time the matching circuit changes the target switch state of the capacitance adjustment switches, the switch state of the protection-object switch may be changed intermittently, with a time interval between changes.

When the parameter that reflects the load-side impedance is sampled at a set sampling period and the matching calculation unit 32A is configured so as to perform matching calculation each time the parameter is sampled, as in the present embodiment, the switch control unit 32C can also be configured so as to reduce a frequency of switching operation by the protection-object switch by controlling the matching calculation unit 32A so that the period at which the parameter used by the load-side impedance calculation means 32A1 of the matching calculation unit 32A to determine the load-side impedance is sampled from the high-frequency detection unit 4 is longer than a set normal sampling period when the temperature increase suppression control is performed.

An optimum duration of the "temperature increase suppression period" for which control (temperature increase suppression control) for suppressing a temperature increase in a capacitance adjustment switch is performed can be determined, for example, by conducting an experiment in which the capacitance adjustment switch is turned ON and OFF at high frequency to increase the temperature thereof to the allowable limit, after which the switching operation of the capacitance adjustment switch is stopped, or temperature increase suppression control for reducing the frequency of the switching operation is started, and the time is calculated that is required for the temperature of the capacitance adjustment switch to decrease to an allowable temperature even when switching operation is resumed after stopping switching operation of the capacitance adjustment switch or after the start of temperature increase suppression control.

<Protection-Object Switch>

The protection-object switch is a switch, from among the capacitance adjustment switches provided to the matching circuit 31, for which temperature increase suppression control is performed in order to prevent the switch from being destroyed by an excessive temperature increase. The protection-object switch may be all of the capacitance adjustment switches provided to the matching circuit or a portion of the capacitance adjustment switches provided to the matching circuit. In a preferred embodiment of the present invention, at least one capacitance adjustment switch including a capacitance adjustment switch having a high probability of reaching a state in which suppression of a temperature increase is required when a state of varying load-side impedance is continued is selected as the protection-object switch from among the capacitance adjustment switches provided to the matching circuit.

From among the series of capacitance adjustment switches provided to the matching circuit 31, when a switch is known in advance to have a high probability of reaching a state in which suppression of a temperature increase is required due to frequent switching ON and OFF when a state of varying load-side impedance is continued, such a switch should be designated as a protection-object switch; however, when it is unclear whether there is a switch that has a high probability of reaching a state in which suppression of a temperature increase is required due to frequent switching ON and OFF when a state of varying load-side impedance is continued, it is preferred that all of the capacitance adjustment switches provided to the matching circuit be designated as protection-object switches.

A switch having a high probability of reaching a state in which suppression of a temperature increase is required when a state of varying load-side impedance is continued is defined as, for example, a switch that is turned ON and OFF when the value of a lower-order digit of the capacitance in the variable capacitors is adjusted, from among the series of capacitance adjustment switches provided to the variable capacitors, or a monitoring-object switch that is evaluated by the change frequency evaluation means as having a switch state change frequency equal to or greater than the set evaluation reference value from among the monitoring-object switches.

It is sometimes simpler to designate all of the capacitance adjustment switches provided to the matching circuit 31 as protection-object switches and to perform temperature increase suppression control for all of the capacitance adjustment switches equally than to designate only some of the series of capacitance adjustment switches provided to the matching circuit as protection-object switches and to perform temperature increase suppression control thereof. In such a case, from the perspective of facilitating temperature increase suppression control, all of the capacitance adjustment switches provided to the matching circuit can be designated as protection-object switches even when it is possible to specify a capacitance adjustment switch that requires temperature increase suppression.

<Operation of the Impedance Matching Device>

The operation of the impedance matching device according to the present embodiment will be described with reference to FIG. 12. In the following description of operation, all of the capacitance adjustment switches provided to the variable capacitors VC1 and VC2 are designated as monitoring-object switches, and all of the monitoring-object switches are designated as protection-object switches.

Figure 12:
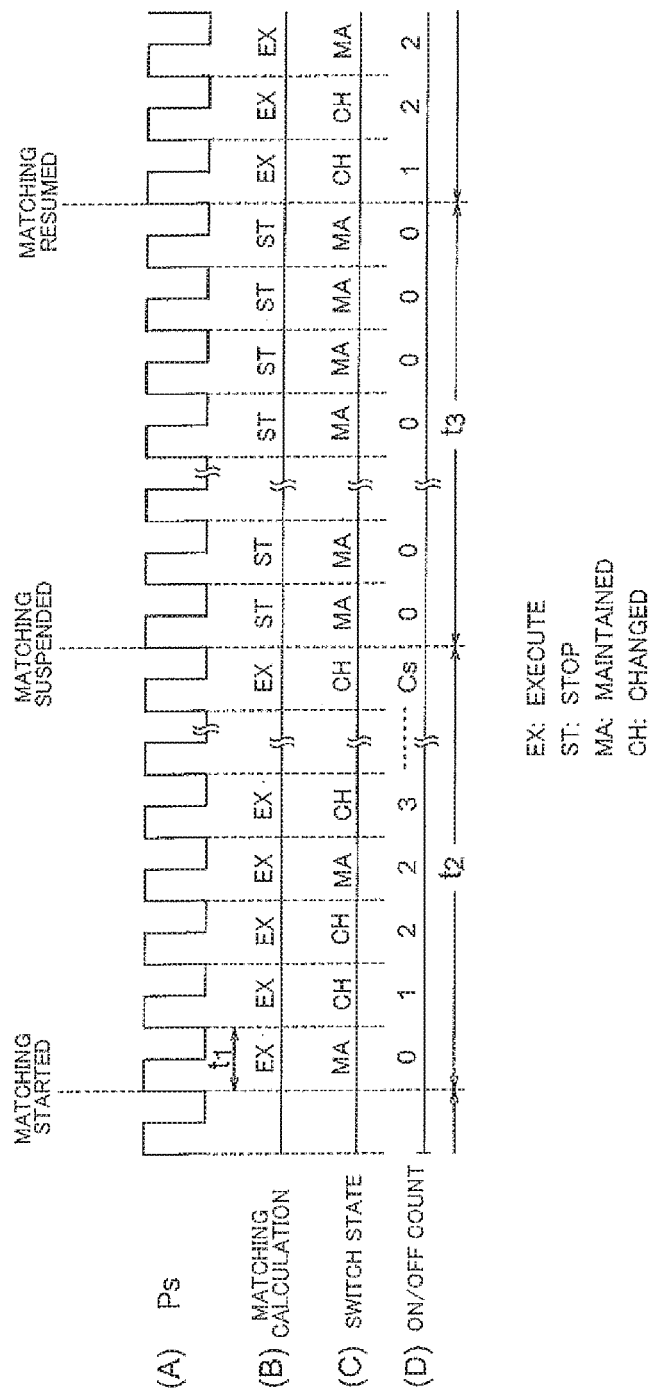
FIG. 12 is a time chart for explaining an operation of an embodiment of the present invention.

FIG. 12 is a time chart illustrating an example of the operation of the impedance matching device according to the present embodiment, and FIG. 12(A) illustrates the sample pulse Ps generated by a pulse generator not illustrated in the drawing. The pulse Ps is generated at a fixed sampling period t1. FIG. 12(B) illustrates the operation of the matching calculation unit 32A, and FIG. 12(C) shows the change in the states of the series of capacitance adjustment switches S1-Sn provided to the matching circuit 31 to vary the capacitance of the variable capacitors provided to the matching circuit. FIG. 12(D) shows the count value of the number of times (ON/OFF count) the switch state of the series of capacitance adjustment switches is changed.

When two variable capacitors VC1 and VC2 are provided to the matching circuit 31 as in the present embodiment, the variation in the states of the capacitance adjustment switches S1-Sn provided to the variable capacitor VC1 and the variation in the states of the capacitance adjustment switches S1-Sn provided to the variable capacitor VC2 generally differ, but to simplify the description below, the variation in the states of the capacitance adjustment switches S1-Sn provided to the variable capacitor VC1 and the variation in the states of the capacitance adjustment switches S1-Sn provided to the variable capacitor VC2 are assumed to be the same.

In FIG. 12(B), "execute" indicates that matching calculation is performed, and "stop" indicates that matching calculation is stopped. In FIG. 12(C), "maintained" means that the load-side impedance calculated when the sample pulse was generated is unchanged from the load-side impedance calculated the last time the sample pulse was generated, and the matching calculation unit 32A has not changed the target switch state, and that the ON/OFF states of the series of capacitance adjustment switches provided to the matching circuit are therefore maintained. In FIG. 12(C), "changed" means that the combination pattern of the switch states of the series of capacitance adjustment switches provided to the variable capacitors of the matching circuit has changed due to variation of the ON/OFF state of at least one of the series of capacitance adjustment switches.

In FIG. 12(D), "ON/OFF count" indicates the count value of the number of times the switch state of the capacitance adjustment switches is changed, and "Cs" indicates the set evaluation reference value (reference value that is compared with the change count to evaluate whether the frequency with which the switch state of the capacitance adjustment switches is changed is equal to or greater than a set allowable limit). The symbol t2 at the bottom of FIG. 12 indicates the evaluation reference time, and t3 indicates the temperature increase suppression period.

In the present embodiment, when matching operation of the impedance matching device is started, matching calculation is executed each time the sample pulse Ps is generated. As a result, when the target switch state is changed, the combination pattern of switch states of the series of capacitance adjustment switches of the matching circuit is changed. The target switch state is a state in which the series of capacitance adjustment switches provided to the variable capacitors should take in order for the impedance between the high-frequency power source 1 and the load 2 to be matched. When the parameter that reflects the load-side impedance is sampled from the high-frequency detection unit 4 and the load-side impedance is calculated, and as a result, there is no variation in the load-side impedance and the target switch state is not changed, the combination pattern of switch states of the series of capacitance adjustment switches provided for prescribing the capacitance of the variable capacitors of the matching circuit is maintained in the same state as at the previous sampling time.

The count value of a number of changes to the switch state of the capacitance adjustment switches is incremented each time the switch state of the capacitance adjustment switches is changed in synchronization with the sample pulse Ps, and when the switch state from the previous sampling time is maintained, the count value from the previous sampling time is maintained.

In the present embodiment, a timer is started at the same time that matching operation is started, and an elapsed time is measured, and the timer is reset each time the elapsed time reaches the set evaluation reference time t2. Each time the evaluation reference time t2 is measured by the timer, the change frequency evaluation means 32B1 compares the count value (switch state change frequency) of the number of changes to the switch state of the capacitance adjustment switches with the set evaluation reference value Cs, and evaluates whether the count value of the number of changes is equal to or greater than the evaluation reference value. When the result of the evaluation indicates that the count value of the number of changes is less than the evaluation reference value, an evaluation is made that there is no switch among the capacitance adjustment switches provided to the matching circuit 31 that requires suppression of a temperature increase, and when the count value of the number of changes is equal to or greater than the evaluation reference value, an evaluation is made that at least one of the capacitance adjustment switches provided to the matching circuit requires suppression of a temperature increase.

Each time an evaluation is made that at least one of the capacitance adjustment switches provided to the matching circuit requires suppression of a temperature increase, the set temperature increase suppression period t3 is measured, and temperature increase suppression control is performed for the measured temperature increase suppression period t3.

In the example illustrated in FIG. 12, the matching calculation unit 32A is configured so as to perform temperature increase suppression control by stopping the matching calculation for the temperature increase suppression period t3, as indicated in FIG. 12(B). In this configuration, the number of times that the matching calculation unit 32A changes the target switch state and the number of times that the switch state of the series of capacitance adjustment switches of the matching circuit is changed are the same, and the number of times that the switch state of the capacitance adjustment switches is changed can therefore be counted simply by counting the number of times that the matching calculation unit changes the target switch state. However, the present invention is not limited to such a configuration of the matching calculation unit, and the matching calculation unit 32A may also be configured so that matching calculation is executed also during the temperature increase suppression period t3, as in the example illustrated in FIG. 13. In this configuration, after the temperature increase suppression period t3 has elapsed, the target switch state can be made appropriate for the load-side impedance at the time when control for causing the switch state of the capacitance adjustment switches to coincide with the target switch state is resumed, and error in the impedance matching can therefore be minimized.

In a case in which matching calculation is executed also during the temperature increase suppression period each time the sample pulse is generated, as illustrated in FIG. 13, by also configuring the change frequency evaluation means 32B1 so as to stop counting the number of times that the matching calculation unit 32A changes the target switch state during the temperature increase suppression period t3 and to count the number of times that the matching calculation unit 32A changes the target switch state for during the evaluation reference time t2, it is possible to determine the number of times (switch state change frequency) the switch state of the series of capacitance adjustment switches of the variable capacitors is changed from the number of times that the matching calculation unit 32A changes the target switch state.

The evaluation reference value Cs, the evaluation reference time t2, and the temperature increase suppression period t3 are set on the basis of experimentation in consideration of proper values thereof for keeping junction temperatures of the semiconductor elements constituting the capacitance adjustment switches within an allowable range, keeping the impedance matching error in the range necessary for ensuring operation of the load, and keeping reflected power within an allowable range. A junction temperature of a capacitance adjustment switch can be estimated by detecting the surface temperature of the capacitance adjustment switch, for example.

When a configuration is adopted in which the switch state evaluation unit 32B is provided for evaluating (evaluating the necessity of temperature increase suppression) whether at least one of the capacitance adjustment switches S1-Sn provided to the matching circuit 31 is in a state requiring suppression of a temperature increase, at least one of the capacitance adjustment switches S1-Sn provided to the matching circuit 31 is designated as a protection-object switch when an evaluation is made by the evaluation unit that at least one of the capacitance adjustment switches S1-Sn provided in the matching circuit 31 is in a state requiring suppression of a temperature increase, and temperature increase suppression control for suppressing a temperature increase in the protection-object switch by stopping switching operation of the protection-object switch or reducing the frequency with which the protection-object switch performs switching operation is performed for the set temperature increase suppression period, as in the present embodiment, it is possible to eliminate or limit heat generation from the protection-object switch for the duration of the temperature increase suppression period and to suppress a temperature increase therein, and appropriate protection of the capacitance adjustment switches can therefore be achieved. For a period other than the temperature increase suppression period, switch control is also performed for causing the switch state of the series of capacitance adjustment switches provided to the matching circuit to coincide with the target switch state determined by the matching calculation unit 32A, and it is therefore possible to protect the capacitance adjustment switches without significantly decreasing precision of impedance matching between the high-frequency power source 1 and the load 2.

Figure 10:
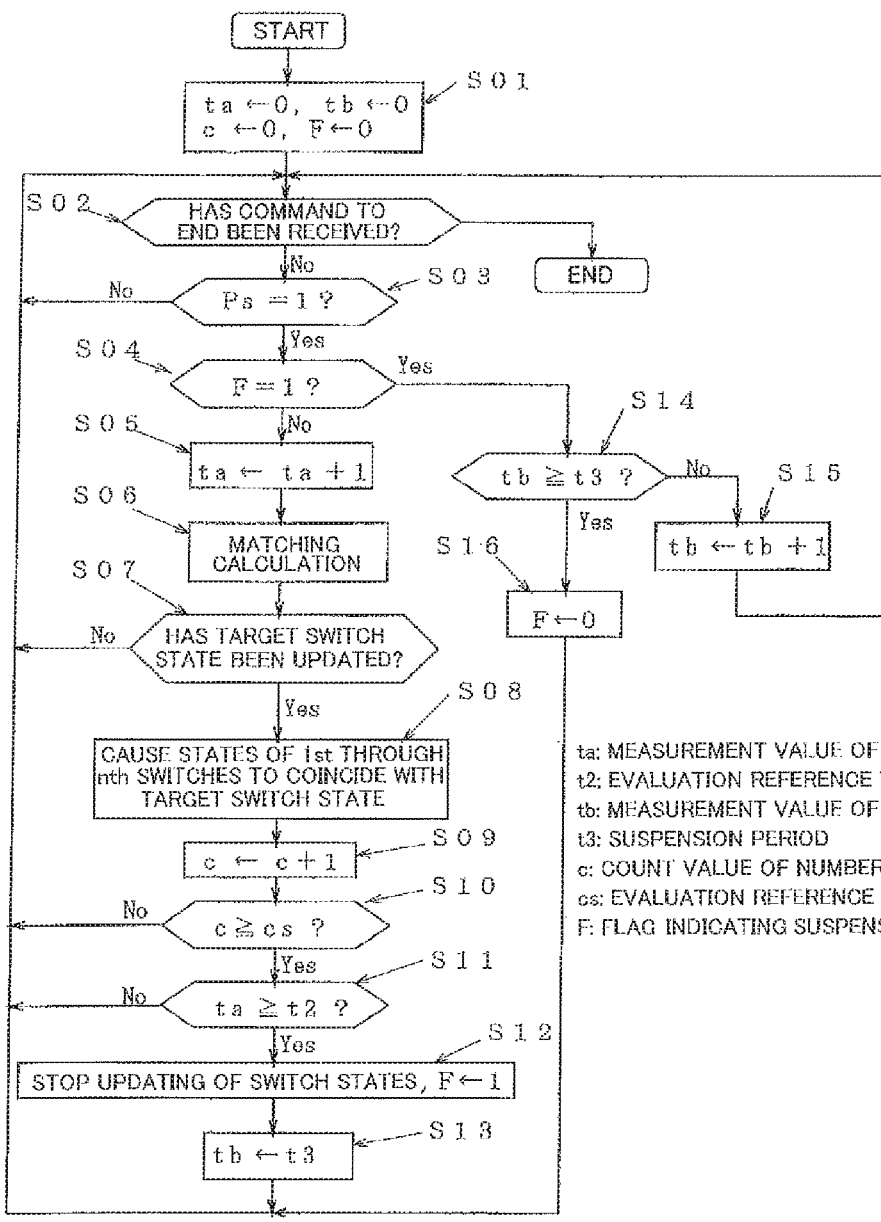
FIG. 10 is a flowchart illustrating an example of an algorithm of a program executed by a microprocessor constituting part of the control unit used in the embodiment illustrated in FIG. 2.

The matching calculation unit 32A, the change frequency evaluation means 32B1, and the switch control unit 32C of the control unit 32 illustrated in FIG. 2 can be realized by causing a microprocessor to execute a predetermined program. FIG. 10 illustrates an example of a processing algorithm executed by a microprocessor in order to constitute the matching calculation unit 32A, the change frequency evaluation means 32B1, and the switch control unit 32C, and is executed every time the sample pulse Ps is generated.

When the algorithm illustrated in FIG. 10 is adopted, in the first step S01 that occurs when a command to start impedance matching operation is received, each component is initialized, the measurement value ta of a first timer for measuring the time elapsed since the start (or resumption) of matching operation, the measurement value tb of a timer for measuring the elapsed time in the temperature increase suppression period, the measurement value c of a counter for counting the number of times the state of the series of capacitance adjustment switches S1-Sn provided to at least one of the variable capacitors of the matching circuit is changed, and a flag F for indicating that the temperature increase suppression period is in effect are reset to 0.

The counting value c of the counter is incremented by 1 when the switch state of the series of capacitance adjustment switches provided to either one of the variable capacitors VC1 and VC2 is changed, as well as when the states of the series of capacitance adjustment switches S1-Sn provided to all of the variable capacitors VC1 and VC2 of the matching circuit are changed.

After each component is initialized in step S01, the algorithm proceeds to step S02, an evaluation is made as to whether a command to end matching operation has been received and when a command of such description has not been received, the algorithm proceeds to step S03 and waits until the sample pulse Ps is generated. When an evaluation is made in step S03 that the sample pulse Ps has been generated, the algorithm proceeds to step S04, and an evaluation is made as to whether the flag F is set to 1. When the result of the evaluation indicates that the flag F is not set to 1, the algorithm proceeds to step S05 and the measurement value ta of the first timer is incremented by 1. The algorithm next proceeds to step S06, and matching calculation is performed which includes a process for calculating the impedance viewed from the output terminal of the high-frequency power source 1 toward the load, and a process for determining the state to be assumed by the series of capacitance adjustment switches S1-Sn provided to the variable capacitor VC1 and the state to be assumed by the series of capacitance adjustment switches S1-Sn provided to the variable capacitor VC2 as the target switch state of the capacitance adjustment switches S1-Sn of the variable capacitor VC1 and the target switch state of the capacitance adjustment switches S1-Sn of the variable capacitor VC2, respectively, in order to match the calculated impedance to the output impedance of the high-frequency power source.

After the matching calculation is performed, the algorithm proceeds to step S07 and an evaluation is made as to whether the target switch state is changed, and when the target switch state of the capacitance adjustment switches S1-Sn of the variable capacitor VC1 and the target switch state of the capacitance adjustment switches S1-Sn of the variable capacitor VC2 are both unchanged, the algorithm returns to step S02. When an evaluation is made in step S07 that the target switch state of the of the capacitance adjustment switches S1-Sn of the variable capacitor VC1 and/or the target switch state of the capacitance adjustment switches S1-Sn of the variable capacitor VC2 has been changed, the algorithm proceeds to step S08, and processing is performed for causing the states of the first through $n^{th}$ capacitance adjustment switches S1-Sn of the variable capacitor VC1 and the states of the first through $n^{th}$ capacitance adjustment switches S1-Sn of the variable capacitor VC2 each to coincide with the target switch state. The algorithm then proceeds to step S09, and the counting value c of the counter for counting the number of changes to the state of the capacitance adjustment switches S1-Sn is incremented by 1.

After step S09 is executed, the algorithm proceeds to step S10 and an evaluation is made as to whether the counting value c of the counter is equal to or greater than the evaluation reference value Cs. When the evaluation is not that that C≥Cs, the algorithm returns to step S02, and when C≥Cs, the algorithm proceeds to step S11, and an evaluation is made as to whether the elapsed time ta from the start of the matching operation is equal to or greater than the evaluation reference time t2. When the result of the evaluation indicates that the elapsed time ta is not equal to or greater than the evaluation reference time t2, the algorithm returns to step S02, and when the elapsed time ta is equal to or greater than the evaluation reference time t2, the algorithm proceeds to step S12, and changing of the states of the capacitance adjustment switches S1-Sn of the variable capacitors is stopped (maintained at the current state) and the flag F is set to 1. The algorithm then returns to step S02 after the measurement value tb of the second timer for measuring the elapsed time in the temperature increase suppression period is set in step S13 to the set temperature increase suppression period t3.

When the transition to step S02 is made in a state in which the flag F is set to 1, since the flag F is evaluated as being 1 in step S04, the algorithm then transitions to step S14 and an evaluation is made as to whether the measurement value tb of the second timer has reached the temperature increase suppression period t3. When the result of the evaluation is that the measurement value tb of the second timer has not reached the temperature increase suppression period t3, the algorithm proceeds to step S15 and the measurement value tb of the second timer is incremented by 1, and the algorithm returns to step S02. Until measurement value tb of the second timer reaches the set temperature increase suppression period t3 the process of step S02→S03→S04→S14→S15→S02 is repeated in a state in which changing of the states of the capacitance adjustment switches S1-Sn of the variable capacitors is stopped, and the state of the capacitance adjustment switches S1-Sn of the variable capacitor VC1 and the state of the capacitance adjustment switches S1-Sn of the variable capacitor VC2 are therefore maintained unchanged. The state of the capacitance adjustment switches S1-Sn of the variable capacitors is thus maintained for the set temperature increase suppression period t3 in the state thereof immediately prior to the start of the temperature increase suppression period t3.

When the evaluation is made in step S14 that the measurement value tb of the second timer has reached the temperature increase suppression period t3, the algorithm proceeds to step S16 and the flag F is reset to 0, after which the algorithm returns to step S02. The algorithm then proceeds to step S03, and step S04 is executed when the evaluation is made in step S03 that the sample pulse Ps has been generated, but because the flag F is then evaluated as not being 1 in step S04, the steps including and subsequent to step S05 are executed, and matching calculation and changing of the states of the capacitance adjustment switches S1-Sn of the variable capacitors are resumed.

When an evaluation is made that the number of changes to the state of the capacitance adjustment switches S1-Sn made in the evaluation reference time t2 is less than the set evaluation reference value Cs, as described above, control is performed for causing the state of the capacitance adjustment switches S1-Sn to coincide with the changed target switch state each time the matching calculation unit changes the target switch state, and when an evaluation is made that the number of changes made in the evaluation reference time is equal to or greater than the set evaluation reference value, control for causing the switch state of the series of capacitance adjustment switches to coincide with the target switch state changed by the matching calculation unit is resumed after a change suspension process is performed for suspending changing of the state of the capacitance adjustment switches S1-Sn for the duration of the set temperature increase suppression period t3.

When the algorithm illustrated in FIG. 10 is adopted, steps S05 through S11 constitute the change frequency evaluation means 32B1, and steps S02 through S04 and steps S12 through S16 constitute the switch control unit 32C.

Figure 11:
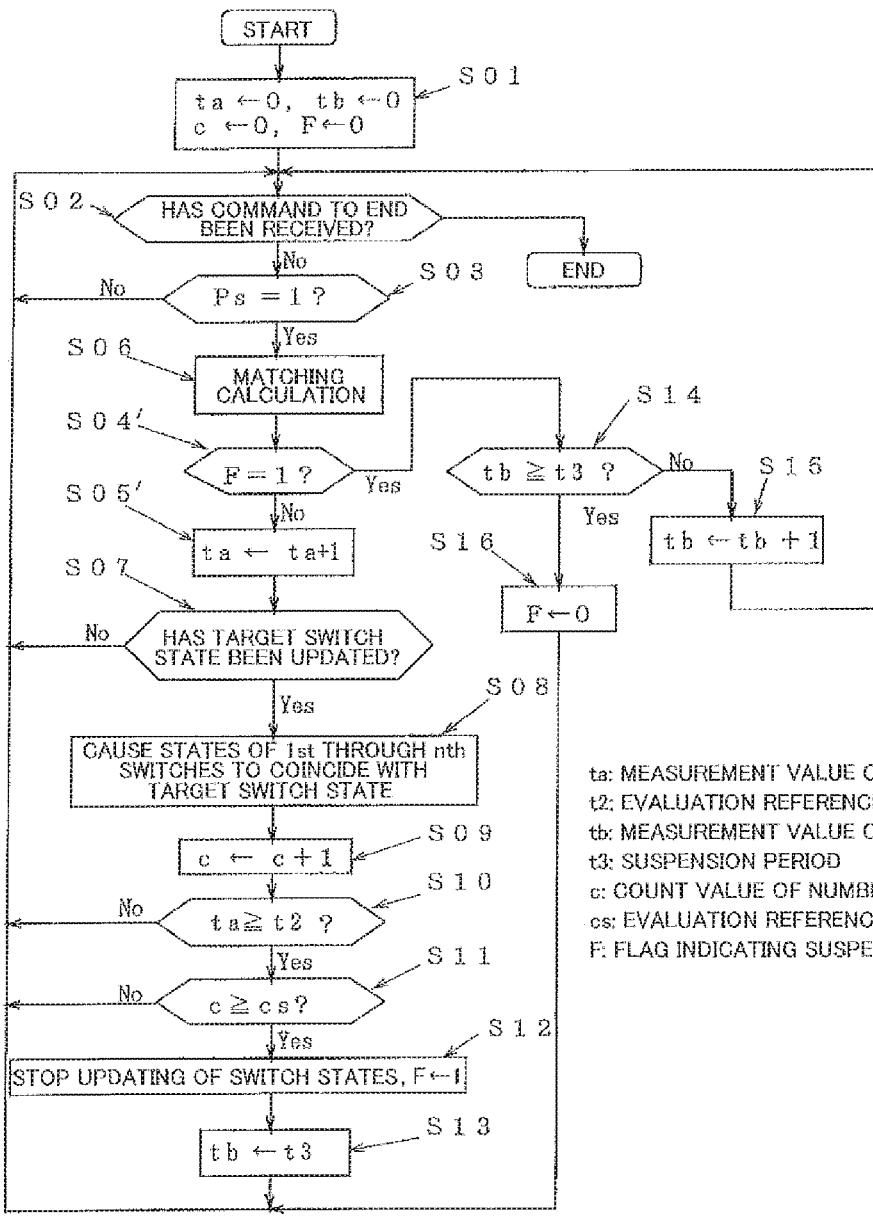
FIG. 11 is a flowchart illustrating another example of the algorithm of a program executed by a microprocessor constituting part of the control unit used in the embodiment illustrated in FIG. 2.

In the case that the algorithm illustrated in FIG. 10 is adopted, the matching calculation unit stops the matching calculation during the temperature increase suppression period t3 and resumes matching calculation after the temperature increase suppression period t3 has elapsed, but the matching calculation unit may also be configured so as to perform matching calculation each time the parameter is sampled during the temperature increase suppression period as well. FIG. 11 is a flowchart illustrating the algorithm of the program executed by the microprocessor when the control unit is configured so that matching calculation is performed each time the parameter is sampled during the temperature increase suppression period as well.

In the algorithm illustrated in FIG. 11, when the pulse Ps is recognized in step S03, the algorithm transitions to step S06 and matching calculation is performed, and the flag F is then set to 1 in step S04', after which the measurement value ta of the first timer is incremented in step S05'. The algorithm illustrated in FIG. 11 is otherwise the same as the algorithm illustrated in FIG. 10.

The evaluation reference value Cs, the evaluation reference time t2, and the temperature increase suppression period t3 may be fixed values or may be changed in accordance with the heat production condition of the capacitance adjustment switches.

Figure 3:
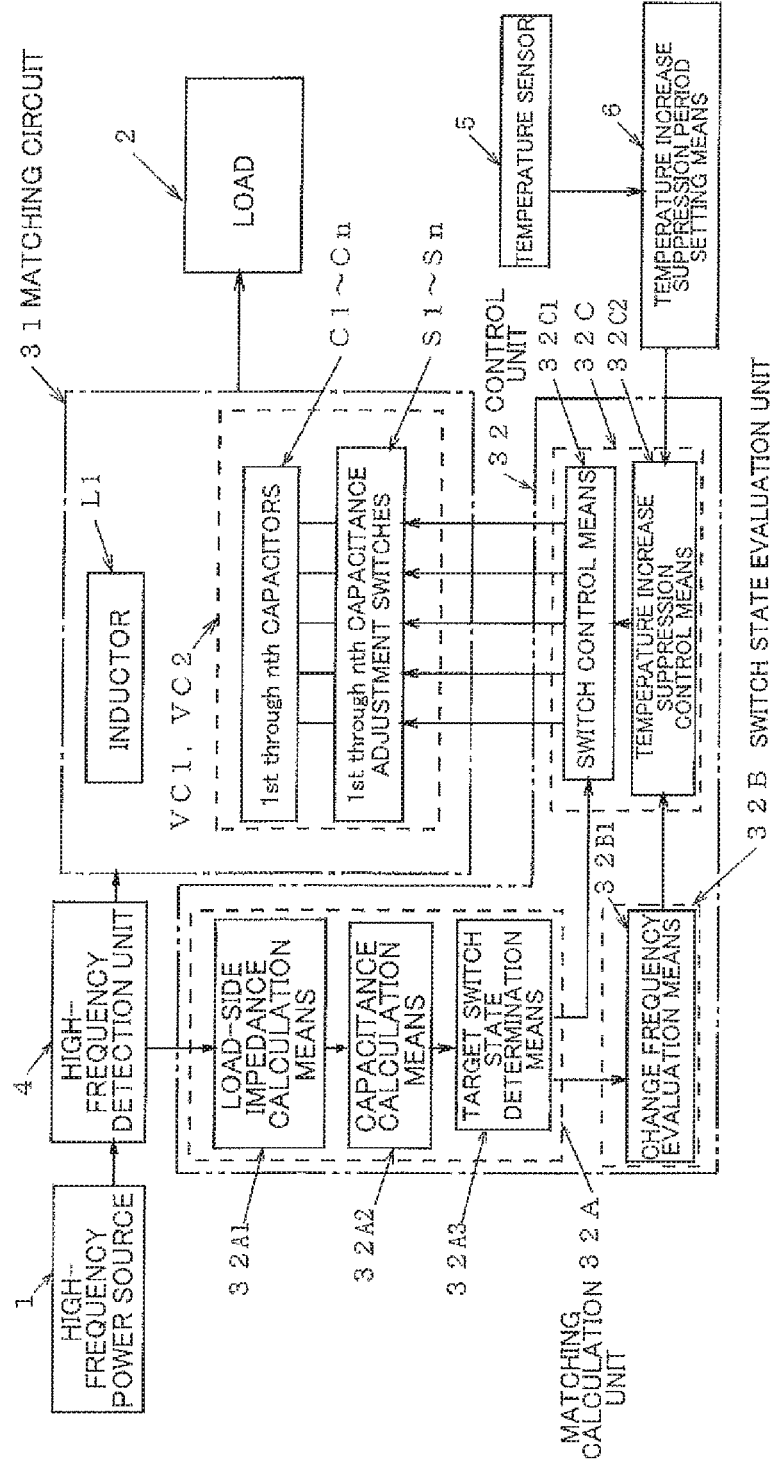
FIG. 3 is a block diagram illustrating another example configuration of the control unit used in an embodiment of the present invention.

For example, as illustrated in FIG. 3, a configuration may be adopted in which a temperature sensor 5 for detecting a temperature that reflects the temperature of the series of capacitance adjustment switches of the variable capacitors, and a temperature increase suppression period setting means 6 for setting the temperature increase suppression period t3 used by the switch control unit 32C in accordance with the temperature detected by the temperature sensor 5 are provided, and the temperature increase suppression period t3 is varied in accordance with the temperature of the capacitance adjustment switches. The temperature increase suppression period setting means 6 in this case can be constituted from a sampling means for sampling the output of the temperature sensor 5 at a fixed period, a temperature increase suppression period calculation means for calculating the temperature increase suppression period for the sampled temperature, and a storage means for storing the calculated temperature increase suppression period in memory.

The temperature increase suppression period can be calculated by retrieving a temperature increase suppression period calculation map for the temperature sampled by the sampling means. The temperature increase suppression period calculation map is made so that the temperature increase suppression period t3 is made longer the higher the temperature detected by the temperature sensor is.

In this case, the temperature increase suppression control means 32C2 reads the newest temperature increase suppression period t3 stored in the memory when the switch state evaluation unit 32B has evaluated that there is a switch that requires suppression of a temperature increase among the capacitance adjustment switches provided to the matching circuit, sets the read temperature increase suppression period t3 in the timer, and causes temperature increase suppression control to be performed as the timer is measuring the set temperature increase suppression period t3.

The temperature that reflects the temperature of the first through $n^{th}$ capacitance adjustment switches S1-Sn may be the temperature of a substrate on which the first through $n^{th}$ capacitance adjustment switches S1-Sn are mounted, or the temperature of a heat sink or the like devised to dissipate heat from the capacitance adjustment switches, for example.

When such a configuration is adopted, the temperature increase suppression period for suspending changing of the switch state of the series of capacitance adjustment switches can be set to an appropriate duration in accordance with the temperature of the capacitance adjustment switches, and it is therefore possible to achieve reliable protection of the series of capacitance adjustment switches while suppressing a decrease in the precision of impedance matching.

Figure 4:
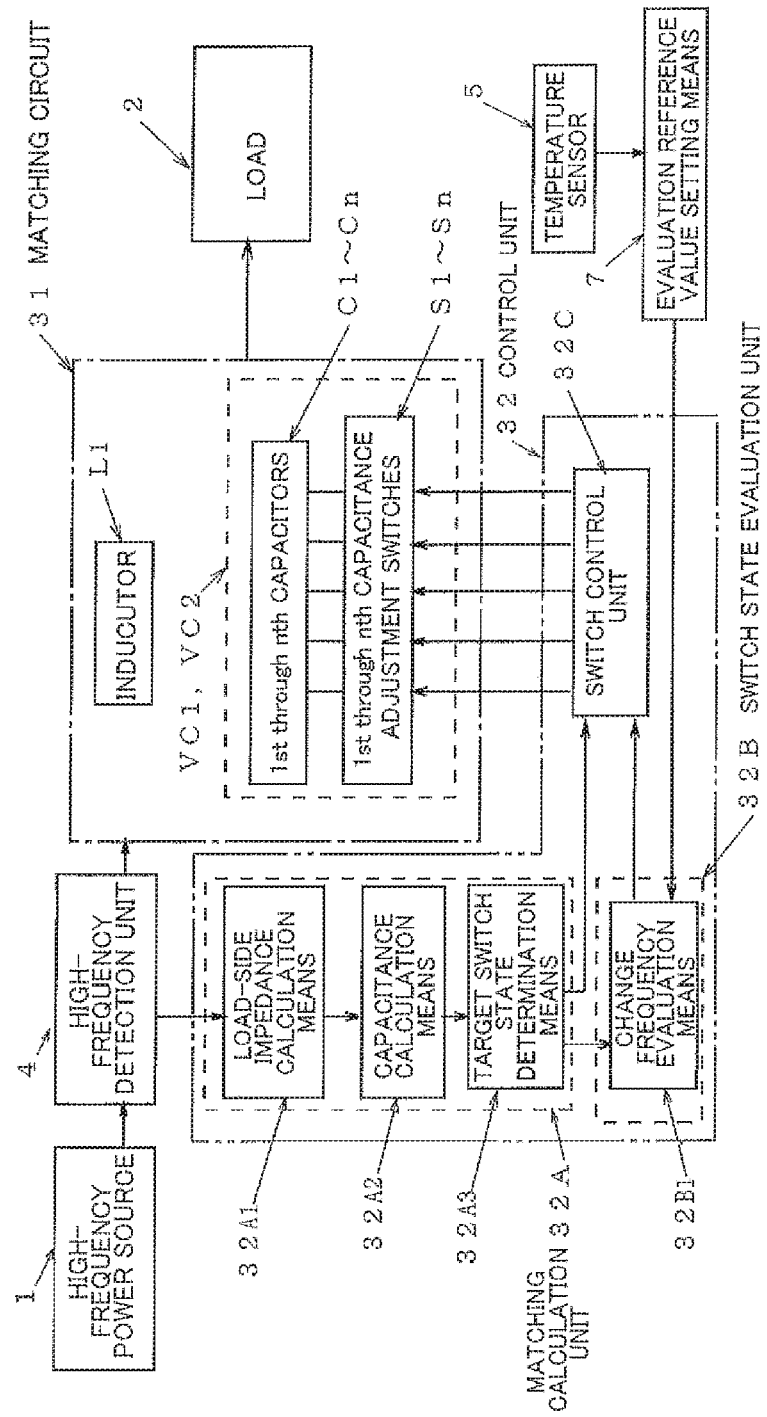
FIG. 4 is a block diagram illustrating yet another example configuration of the control unit used in an embodiment of the present invention.

As illustrated in FIG. 4, a configuration may also be adopted in which a temperature sensor 5 for detecting a temperature that reflects the temperature of the series of capacitance adjustment switches of the variable capacitors, and an evaluation reference value setting means 7 for setting the evaluation reference value used by the change frequency evaluation means 32B1 in accordance with the temperature detected by the temperature sensor 5 are provided, and the evaluation reference value is varied in accordance with the temperature of the series of capacitance adjustment switches. The evaluation reference value setting means 7 in this case is configured so as to make the evaluation reference value smaller the higher the temperature detected by the temperature sensor 5 is. The evaluation reference value setting means 7 can be configured so as to calculate the evaluation reference value as needed for the temperature detected by the temperature sensor 5 and cause the calculated evaluation reference value to be stored in memory, in the same manner as in the temperature increase suppression period setting means illustrated in FIG. 3.

When such a configuration is adopted, changing of the switch state of the capacitance adjustment switches can be suspended more often the higher the temperature of the series of capacitance adjustment switches is, and changing of the switch state of the capacitance adjustment switches can be suspended less often when the temperature of the series of capacitance adjustment switches is not so high. Changing of the switch state of the capacitance adjustment switches can therefore be suspended with a frequency that is appropriate for the temperature of the series of capacitance adjustment switches, and it is possible to achieve reliable protection of the series of capacitance adjustment switches while suppressing a decrease in the precision of impedance matching.

Figure 5:
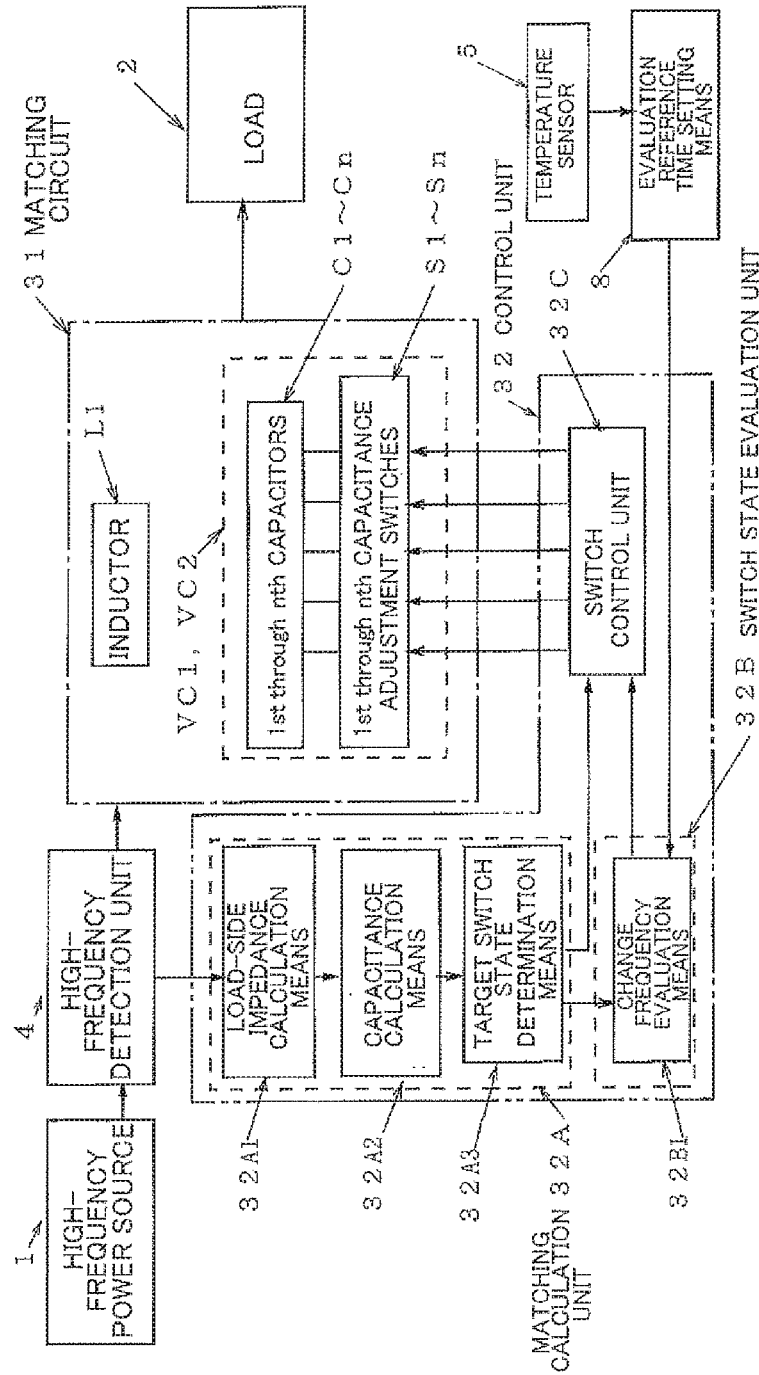
FIG. 5 is a block diagram illustrating yet another example configuration of the control unit used in an embodiment of the present invention.

As illustrated in FIG. 5, a configuration may also be adopted in which a temperature sensor 5 for detecting a temperature that reflects the temperature of the series of capacitance adjustment switches, and an evaluation reference time setting means 8 for setting the evaluation reference time used by the change frequency evaluation means 32B1 in accordance with the temperature detected by the temperature sensor 5 are provided, and the evaluation reference time is varied in accordance with the temperature of the capacitance adjustment switches. The evaluation reference time setting means 8 in this case is configured so as to make the evaluation reference time shorter the higher the temperature detected by the temperature sensor 5 is.

Through this configuration as well, because changing of the switch state of the capacitance adjustment switches can be suspended with a frequency that is appropriate for the temperature of the series of capacitance adjustment switches, it is possible to achieve reliable protection of the capacitance adjustment switches while suppressing a decrease in the precision of impedance matching.

Figure 6:
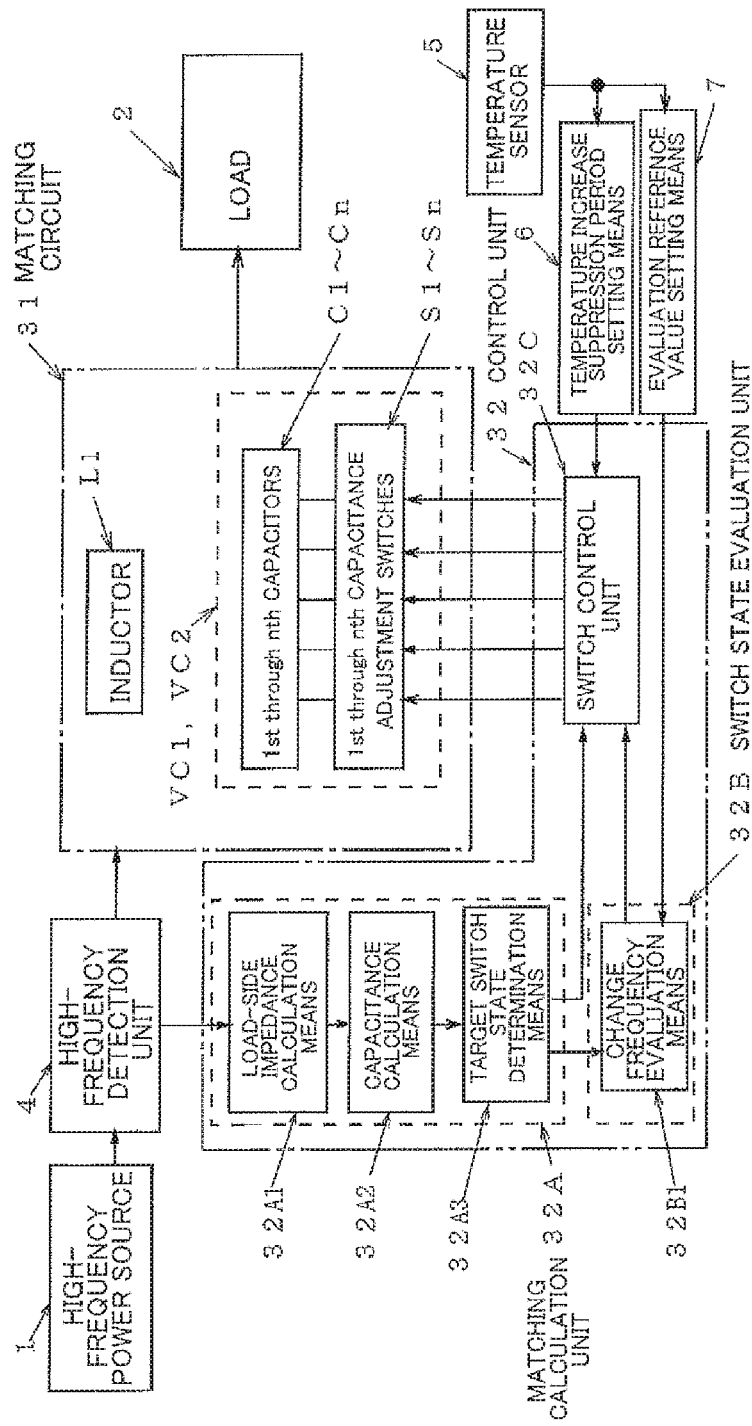
FIG. 6 is a block diagram illustrating yet another example configuration of the control unit used in an embodiment of the present invention.

Furthermore, as illustrated in FIG. 6, a configuration may be adopted in which a temperature sensor 5 for detecting a temperature that reflects the temperature of the series of capacitance adjustment switches, a temperature increase suppression period setting means 6 for setting the temperature increase suppression period used by the switch control unit 32C in accordance with the temperature detected by the temperature sensor 5, and an evaluation reference value setting means 7 for setting the evaluation reference value used by the change frequency evaluation means 32B1 in accordance with the temperature detected by the temperature sensor 5 are furthermore provided, and the temperature increase suppression period and the evaluation reference value are varied in accordance with the temperature of the series of capacitance adjustment switches. The temperature increase suppression period setting means 6 in this case is configured so as to make the temperature increase suppression period longer the higher the temperature detected by the temperature sensor 5 is, and the evaluation reference value setting means 7 is configured so as to make the evaluation reference value smaller the higher the temperature detected by the temperature sensor 5 is.

When such a configuration is adopted, not only can the period for suspending changing of the switch state of the capacitance adjustment switches be set to an appropriate duration in accordance with the temperature of the capacitance adjustment switches, but changing of the switch state of the capacitance adjustment switches can also be suspended with an appropriate frequency in accordance with the temperature of the series of capacitance adjustment switches, and it is therefore possible to achieve reliable protection of the series of capacitance adjustment switches while suppressing a decrease in the precision of impedance matching.

Figure 7:
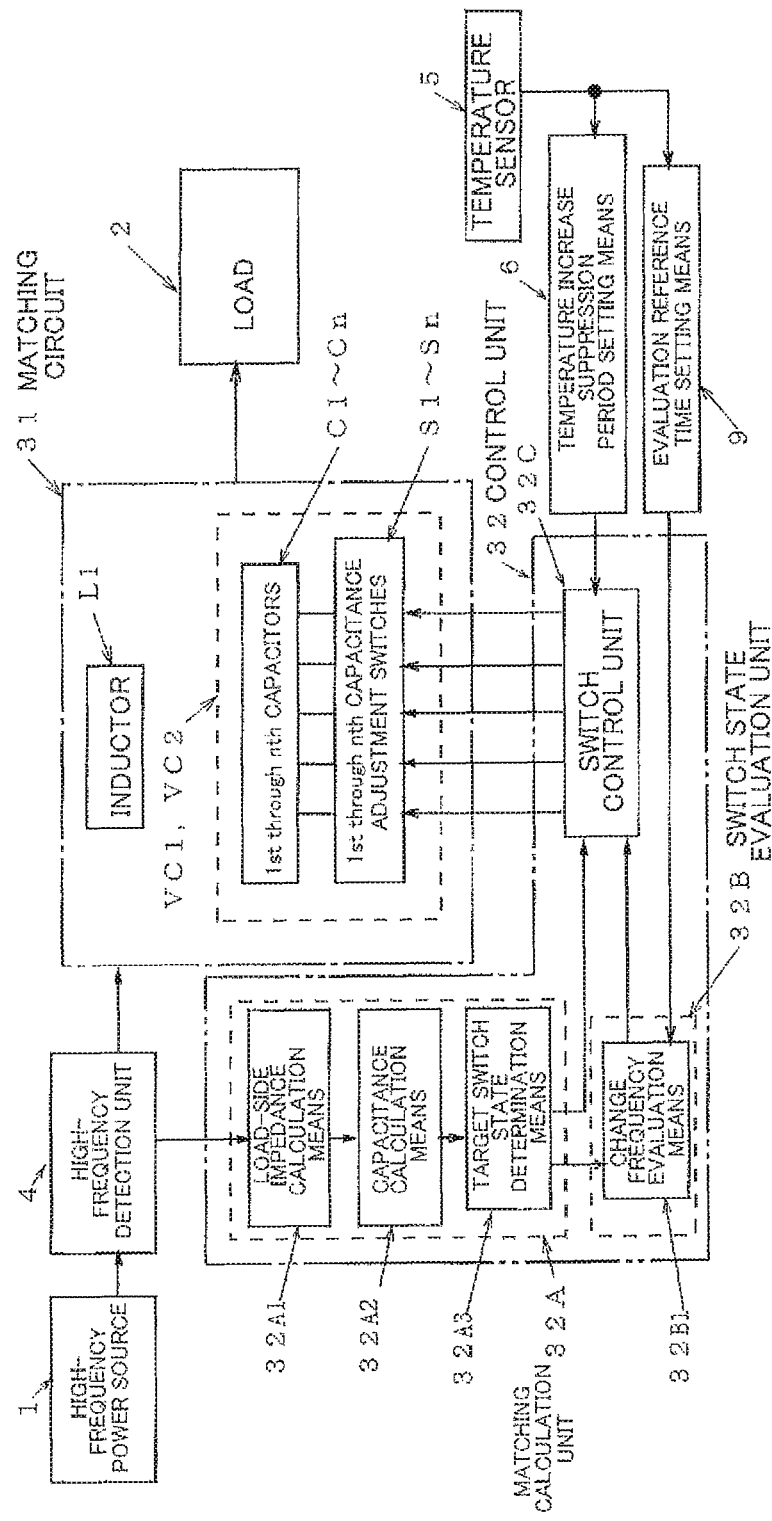
FIG. 7 is a block diagram illustrating yet another example configuration of the control unit used in an embodiment of the present invention.

Furthermore, as illustrated in FIG. 7, a configuration may be adopted in which a temperature sensor 5 for detecting a temperature that reflects the temperature of the series of capacitance adjustment switches, a temperature increase suppression period setting means 6 for setting the temperature increase suppression period used by the switch control unit 32C in accordance with the temperature detected by the temperature sensor 5, and an evaluation reference time setting means 9 for setting the evaluation reference time used by the change frequency evaluation means 32B1 in accordance with the temperature detected by the temperature sensor 5 are provided, and the temperature increase suppression period t3 and the evaluation reference time t2 varied in accordance with the temperature of the series of capacitance adjustment switches. The temperature increase suppression period setting means 6 in this case is configured so as to make the temperature increase suppression period longer the higher the temperature detected by the temperature sensor 5 is, and the evaluation reference time setting means 9 is configured so as to make the evaluation reference time shorter the higher the temperature detected by the temperature sensor 5 is.

It is also the case that when such a configuration is adopted, changing of the switch state of the capacitance adjustment switches can be suspended more often the higher the temperature of the series of capacitance adjustment switches is, and changing of the switch state of the capacitance adjustment switches can be suspended less often when the temperature of the series of capacitance adjustment switches is not so high. Changing of the switch state of the capacitance adjustment switches can therefore be suspended with a frequency that is appropriate for the temperature of the capacitance adjustment switches, and it is possible to achieve reliable protection of the capacitance adjustment switches while suppressing a decrease in the precision of impedance matching.

<Modification of the Switch State Evaluation Unit>

In the embodiments described above, an evaluation is made as to whether at least one monitoring-object switch is in a state requiring suppression of a temperature increase on the basis of whether the switch state change frequency of the capacitance adjustment switches is equal to or greater than an evaluation reference value; however, the switch state evaluation unit 32B may also be configured so as to evaluate whether at least one monitoring-object switch is in a state requiring suppression of a temperature increase by evaluating whether the occurrence frequency of variation in the load-side impedance is equal to or greater than an evaluation reference value.

Figure 8:
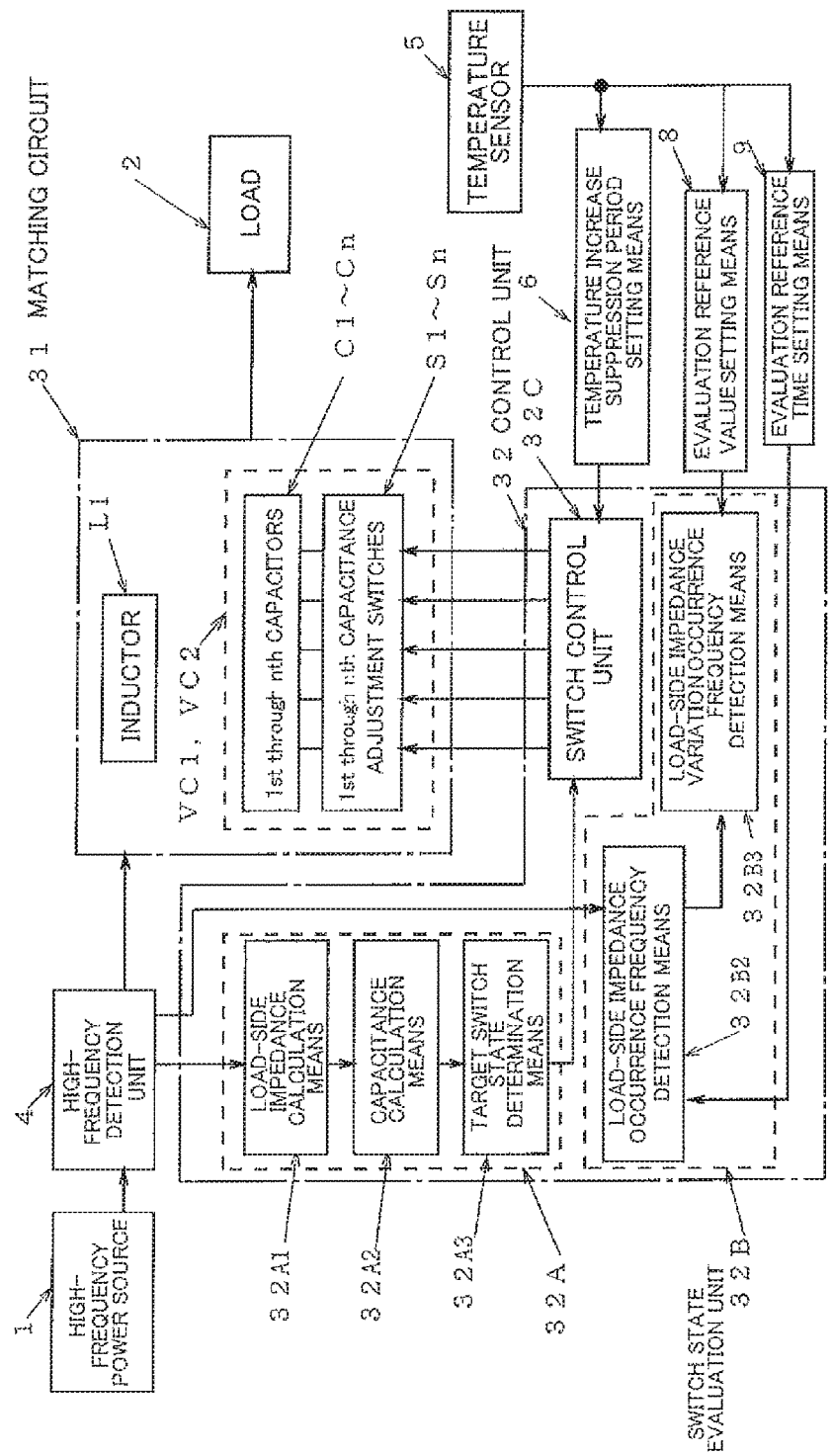
FIG. 8 is a block diagram illustrating yet another example configuration of the control unit used in an embodiment of the present invention.

FIG. 8 illustrates an embodiment in which the switch state evaluation unit 32B is configured as described above. In the example illustrated in FIG. 8, the switch state evaluation unit 32B is constituted from a load-side impedance occurrence frequency detection means 32B2 and a load-side impedance variation occurrence frequency evaluation means 32B3. Here, the load-side impedance occurrence frequency detection means 32B2 is a means for detecting, as a load-side impedance variation occurrence frequency, a number of times that the impedance viewed from the output terminal of the high-frequency power source 1 toward the load 2 undergoes a variation greater than or equal to a set size in a set evaluation reference time, and the load-side impedance variation occurrence frequency evaluation means 32B3 is a means for evaluating whether the load-side impedance variation occurrence frequency detected by the load-side impedance occurrence frequency detection means 32B2 is equal to or greater than a set evaluation reference value. The switch state evaluation unit 32B is configured so as to evaluate that at least one of the capacitance adjustment switches provided to the matching circuit 31 is in a state requiring suppression of a temperature increase when an evaluation is made by the load-side impedance variation occurrence frequency evaluation means 32B3 that the load-side impedance variation occurrence frequency is equal to or greater than the set evaluation reference value.

The load-side impedance occurrence frequency detection means 32B2 illustrated in FIG. 8 is configured so that each time the matching calculation unit 32A samples the parameter that reflects the impedance (load-side impedance) viewed from the output terminal of the high-frequency power source 1 to the load-side circuit, a difference between a parameter at an immediately preceding sampling thereof and a parameter at a current sampling thereof is detected as the parameter variation amount, and a number of times that a parameter variation amount equal to or greater than a set size is detected in a set evaluation reference time is designated as the load-side impedance variation occurrence frequency. A reflection coefficient, for example, can be used as a parameter that reflects the load-side impedance.

The evaluation reference value and the evaluation reference time may have fixed values, but in order to achieve reliable protection of a protection-object switch, the evaluation reference value and the evaluation reference time may be varied with respect to an appropriate parameter. For example, a temperature sensor may be provided for detecting a temperature that reflects the temperature of the capacitance adjustment switches provided to the matching circuit, and the evaluation reference value may be made smaller the higher the temperature detected by the temperature sensor is, or the evaluation reference time may be made shorter the higher the temperature detected by the temperature sensor is.

In the example illustrated in FIG. 8, a temperature sensor 5 for detecting a temperature that reflects the temperature of the capacitance adjustment switches, a temperature increase suppression period setting means 6 for setting the temperature increase suppression period t3 with respect to the temperature detected by the temperature sensor 5, evaluation reference value setting means 8 for setting the evaluation reference value for comparison with the load-side impedance variation occurrence frequency with respect to the temperature detected by the temperature sensor 5, and an evaluation reference time setting means 9 for setting the evaluation reference time used by the load-side impedance occurrence frequency detection means 32B2 in accordance with the temperature detected by the temperature sensor 5 are provided.

The temperature increase suppression period setting means 6 is configured so as to make the temperature increase suppression period longer the higher the temperature detected by the temperature sensor 5 is, and the evaluation reference value setting means 8 is configured so as to make the evaluation reference value used by the load-side impedance occurrence frequency detection means 32B2 smaller the higher the temperature detected by the temperature sensor 5 is.

<Other Modification of the Switch State Evaluation Unit>

Figure 9:
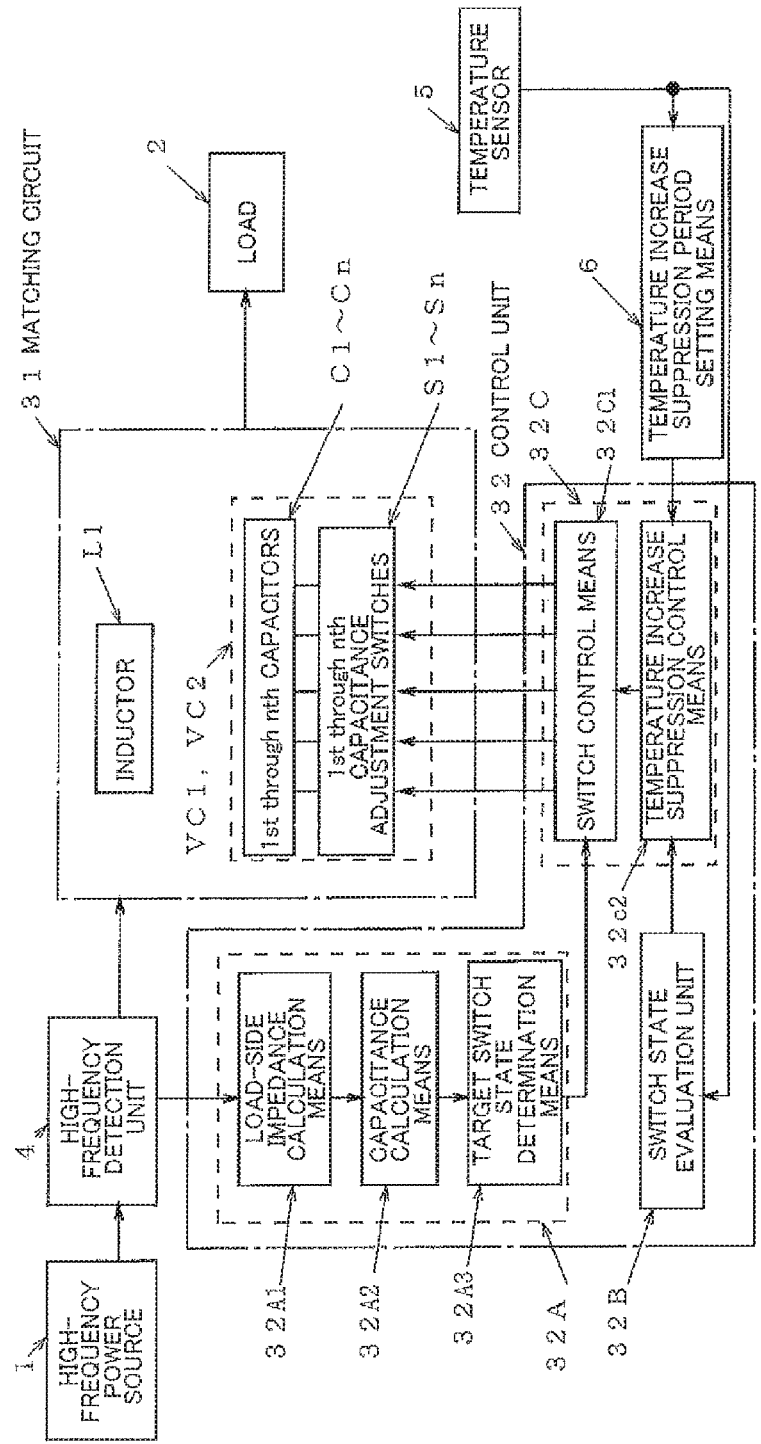
FIG. 9 is a block diagram illustrating yet another example configuration of the control unit used in an embodiment of the present invention.

Another modification of the switch state evaluation unit 32B that can be used in an embodiment of the present invention is described below with reference to FIG. 9. Also in the example illustrated in FIG. 9, a temperature sensor 5 for detecting a temperature that reflects the temperature of the capacitance adjustment switches is provided, and the switch state evaluation unit 32B is configured so that when the temperature detected by the temperature sensor 5 is equal to or greater than a set evaluation reference value, an evaluation is made that at least one of the capacitance adjustment switches provided to the matching circuit 31 is in a state requiring suppression of a temperature increase. Also in the example illustrated in FIG. 9, a temperature increase suppression period setting means 6 is provided for setting the temperature increase suppression period used by the switch control unit 32C, in accordance with the temperature detected by the temperature sensor 5, and the temperature increase suppression period is set to a longer duration the higher the temperature detected by the temperature sensor 5 is.

Other Embodiments

In the above embodiments, the matching calculation unit 32A is configured so as to calculate, as the target capacitance, the value that the capacitance of the variable capacitors VC1 and VC2 should have so as to match together the output impedance of the high-frequency power source and the impedance of the circuit (load-side impedance) viewed from the output terminal of the high-frequency power source toward the load, and is configured so as to determine, as the target switch state, the state that the series of capacitance adjustment switches S1-Sn of the variable capacitors VC1 and VC2 should have in order to set the capacitance of the variable capacitors to the calculated target capacitance. However, it is sufficient ultimately for the matching calculation unit 32A to be capable of determining the state to be assumed by the capacitance adjustment switches S1-Sn of the variable capacitors, and the constitution of the matching calculation unit 32A is not limited to the examples described in the above embodiments.

For example, a configuration may be adopted in which a map is prepared in advance for assigning a relationship between the load-side impedance and the target switch state to be assumed by the capacitance adjustment switches S1-Sn of the variable capacitors, and the target switch state is determined by retrieving the map for the load-side impedance.

In the above description, the load-side impedance is calculated each time the parameter that reflects the load-side impedance is sampled, and the capacitance of the variable capacitors that is needed in order to match the calculated load-side impedance to the output impedance of the high-frequency power source is calculated. However, the method of determining the capacitance of the variable capacitors that is necessary in order to match the load-side impedance to the output impedance of the high-frequency power source 1 is not limited to the examples described in the above embodiments.

For example, the present invention is also applicable when a method is employed in which a high-frequency detection unit (e.g., a directional coupler) for outputting a traveling-wave power detection signal and a reflected-wave power detection signal is used as the high-frequency detection unit 4, and the capacitance of the variable capacitors is determined so that the reflection coefficient calculated from the sampled traveling-wave power detection signal and the reflected-wave power detection signal is set to zero.

In the above description, PIN diodes are used as the first through $n^{th}$ capacitance adjustment switches S1-Sn provided to the variable capacitors, but the first through $n^{th}$ capacitance adjustment switches S1-Sn may be any capacitance adjustment switches that can be switched ON and OFF at high speed, and MOSFETs, for example, can be used instead of PIN diodes.

In the above embodiments, an L-type circuit constituted from one inductor and two variable capacitors is used as the matching circuit 31, as illustrated in FIG. 1, but the constitution of the matching circuit 31 is not limited to the example illustrated in FIG. 1; the present invention can be broadly applied to various types of matching circuits used to match impedance by adjusting the capacitance of a variable capacitor. The number of variable capacitors provided to the matching circuit is also arbitrary.

The load 2 is a plasma load in the above description, but the load 2 to which high-frequency electric power is supplied from the high-frequency power source 1 is not limited to a plasma load in the present invention.

In the examples illustrated in FIGS. 12 and 13, the switch control unit is configured so as to perform temperature increase suppression control for the temperature increase suppression period t3 after the evaluation reference time t2 has elapsed, even when the switch state change frequency has reached the evaluation reference value before the evaluation reference time t2 has elapsed; however, the switch control unit 32C may also be configured so that when the switch state change frequency reaches the evaluation reference value before the evaluation reference time t2 has elapsed, temperature increase suppression control is performed immediately without waiting for the evaluation reference time t2 to elapse.

Various embodiments of the impedance matching device according to the present invention are described above, but the embodiments described above are merely illustrative of possible configurations of the components of the present invention when carrying out the same, and the present invention is not limited to being configured as described in the embodiments. For example, in the above description, when a temperature sensor for detecting a temperature that reflects the temperature of the capacitance adjustment switches is provided, and the temperature increase suppression period is set in accordance with the temperature detected by the temperature sensor, the temperature increase suppression period, the evaluation reference value, and the like are calculated as needed for the temperature detected by the temperature sensor. However, the present invention is not limited to such a configuration, and the temperature increase suppression period may be determined for the temperature detected by the temperature sensor when temperature increase suppression control is performed. Likewise, rather than determining the evaluation reference time or the evaluation reference value as needed for the temperature detected by the temperature sensor, a configuration may be adopted in which the evaluation reference time or the evaluation reference value is determined for the temperature detected by the temperature sensor when the evaluation is made as to whether a monitoring-object switch is in a state requiring suppression of a temperature increase.

In the above description, the switch control unit 32C is constituted from a switch control means 32C1 and a temperature increase suppression control means 32C2, as illustrated in FIG. 2, for example, and in a steady state in which an evaluation is made by the switch state evaluation unit 32B that a monitoring-object switch is not in a state requiring suppression of a temperature increase, the switch state evaluation unit 32B is caused to perform control for making the states of the capacitance adjustment switches coincide with the target switch state, and when an evaluation is made by the switch state evaluation unit 32B that at least one monitoring-object switch is in a state requiring suppression of a temperature increase, a temperature increase suppression control execution command is issued from the temperature increase suppression control means 32C2 to the switch control unit 32C, and the switch control means 32C1 is caused to execute control for suppressing a temperature increase in the protection-object switch. However, the switch control unit 32C need only be configured so as to perform control for causing the states of the capacitance adjustment switches to coincide with the target switch state in a steady state, and to perform temperature increase suppression control for the protection-object switch when at least one monitoring-object switch is evaluated as requiring suppression of a temperature increase, and the configuration of the switch control unit 32C is not limited to the configuration in the above description.

For example, a configuration may be adopted in which the switch control unit 32C is constituted from a "steady-state switch control means" and a "temperature increase suppression switch control means," and when in a steady state in which there is no need for temperature increase suppression control, control for causing the states of the capacitance adjustment switches to coincide with the target switch state is performed by the steady-state switch control means, and when the switch state evaluation unit 32B evaluates that at least one monitoring-object switch is in a state requiring suppression of a temperature increase, control for suppressing a temperature increase in the protection-object switch is performed by the temperature increase suppression switch control means.

INDUSTRIAL APPLICABILITY

The present invention is an electronically controlled impedance matching device for matching an output impedance of a high-frequency power source and an impedance viewed from an output terminal of the high-frequency power source to a load-side circuit. This is achieved through the use of a matching circuit provided with variable capacitors in which a capacitance thereof is adjusted by an ON/OFF operation of switches comprising semiconductor elements in order to increase a speed of matching. The impedance matching device is configured so that the capacitance adjustment switches provided to the variable capacitors can be prevented from excessively increasing in temperature and being destroyed when the switches are turned ON and OFF at high frequency in conjunction with variation of a load-side impedance. The present invention makes it possible for a matching operation to more closely follow variations in the load-side impedance, while providing high reliability to an operation of the capacitance adjustment switches of the variable capacitors. Highly precise impedance matching can therefore be achieved and electric power can be efficiently supplied to a load even when the impedance of the load varies at high frequency. Consequently, the present invention can increase applicability of an electronically controlled impedance matching device in industrial fields in which there is a need to supply high-frequency electric power to a load that has frequent variations in impedance, such as a plasma load.

EXPLANATION OF NUMERALS AND CHARACTERS 1 high-frequency power source
2 load
3 impedance matching device
4 high-frequency detection unit
31 matching circuit
32 control unit
32A matching calculation unit
32A1 load-side impedance calculation means
32A2 capacitance calculation means
32A3 target switch state determination means
32B switch state evaluation unit
32B1 change frequency evaluation means
32B2 load-side impedance variation occurrence frequency detection means
32B3 load-side impedance variation occurrence frequency evaluation means
32C switch control unit
5 temperature sensor
6 temperature increase suppression period setting means
8 evaluation reference time setting means
9 evaluation reference time setting means
L1 inductor
VC1, VC2 variable capacitors
C1-Cn first through $n^{th}$ capacitors
S1-Sn first through $n^{th}$ capacitance adjustment switches

The invention claimed is:

1. An impedance matching device for matching an output impedance of a high-frequency power source and a load-side impedance, which is an impedance of a circuit viewed from an output terminal of the high-frequency power source to a load-side circuit, said impedance matching device comprising:
a matching circuit disposed between said high-frequency power source and a load, the matching circuit being provided with at least one variable capacitor having a structure in which a plurality of capacitance elements are connected in parallel, the capacitance elements being constituted from a capacitor and a capacitance adjustment switch connected in series, and the capacitance adjustment switch comprising a semiconductor element;
a matching calculation unit for performing, at a set period, a matching calculation for determining, as a target switch state, a state in which the capacitance adjustment switches provided to said matching circuit should take in order for the output impedance of said high-frequency power source and said load-side impedance to be matched; a switch control unit for performing control for causing switch states of the capacitance adjustment switches provided to said matching circuit to coincide with said target switch state; and
a switch state evaluation unit for evaluating whether at least one of the capacitance adjustment switches provided to said matching circuit is in a state requiring suppression of a temperature increase;
said switch control unit being configured so that when an evaluation is made by said switch state evaluation unit that at least one of the capacitance adjustment switches provided to said matching circuit is in a state requiring suppression of a temperature increase, the at least one capacitance adjustment switch provided to said matching circuit is designated as a protection-object switch, and temperature increase suppression control for suppressing a temperature increase in said protection-object switch by stopping switching operation of said protection-object switch or reducing a frequency with which said protection-object switch performs switching operation is performed for a set temperature increase suppression period.

2. The impedance matching device of claim 1, wherein:
said switch state evaluation unit is provided with change frequency evaluation means for evaluating whether a switch state change frequency of a monitoring-object switch is equal to or greater than a set evaluation reference value, said monitoring-object switch being at least one of the capacitance adjustment switches provided to said matching circuit, and the switch state change frequency being a number of times that a switch state of the monitoring-object switch is changed from an ON state to an OFF state or from the OFF state to the ON state in a set evaluation reference time, and the switch state evaluation unit is configured so as to evaluate that at least one of the capacitance adjustment switches provided to said matching circuit is in a state requiring suppression of a temperature increase when an evaluation is made by said change frequency evaluation means that the switch state change frequency of at least one monitoring-object switch is equal to or greater than said evaluation reference value.

3. The impedance matching device of claim 2, wherein:
a temperature sensor for detecting a temperature that reflects a temperature of the capacitance adjustment switches provided to said matching circuit, and evaluation reference value setting means for setting the evaluation reference value used by said switch state evaluation means in accordance with the temperature detected by said temperature sensor are further provided; and
said evaluation reference value setting means is configured so as to make said evaluation reference value smaller the higher the temperature detected by said temperature sensor is.

4. The impedance matching device of claim 3, wherein:
temperature increase suppression period setting means for setting said temperature increase suppression period in accordance with the temperature detected by said temperature sensor is further provided; and
said temperature increase suppression period setting means is configured so as to make said temperature increase suppression period longer the higher the temperature detected by said temperature sensor is.

5. The impedance matching device of claim 2, wherein:
said switch state evaluation unit is configured so as to designate at least one variable capacitor provided to said matching circuit as a monitoring-object variable capacitor, and to designate at least one capacitance adjustment switch provided to the monitoring-object variable capacitor as said monitoring-object switch.

6. The impedance matching device of claim 2, wherein:
the switch state change frequency of said monitoring-object switch is a number of times that the switch state of the monitoring-object switch is changed in a set evaluation reference time.

7. The impedance matching device of claim 2, wherein:
the switch state change frequency of said monitoring-object switch is a number of times that said matching calculation unit changes the target switch state of said monitoring-object switch in said evaluation reference time.

8. The impedance matching device of claim 2, wherein:
a temperature sensor for detecting a temperature that reflects a temperature of the capacitance adjustment switches provided to said matching circuit, and evaluation reference time setting means for setting the evaluation reference time used by said switch state evaluation means in accordance with the temperature detected by said temperature sensor are further provided; and
said evaluation reference time setting means is configured so as to make said evaluation reference time shorter the higher the temperature detected by said temperature sensor is.

9. The impedance matching device of claim 2, wherein:
a temperature sensor for detecting a temperature that reflects a temperature of the capacitance adjustment switches provided to said matching circuit, and temperature increase suppression period setting means for setting said temperature increase suppression period in accordance with the temperature detected by said temperature sensor are further provided; and
said temperature increase suppression period setting means is configured so as to make said temperature increase suppression period longer the higher the temperature detected by said temperature sensor is.

10. The impedance matching device of claim 2, wherein:
said switch control unit is configured so that, from among said monitoring-object switches, a monitoring-object switch that is evaluated by said change frequency evaluation means as having a switch state change frequency equal to or greater than the set evaluation reference value is designated as said protection-object switch.

11. The impedance matching device of claim 2, wherein:
said change frequency evaluation means is configured so that in a process of evaluating whether the switch state change frequency of said monitoring-object switch is equal to or greater than the set evaluation reference value, when the switch state change frequency reaches the evaluation reference value before said evaluation reference time has elapsed, the change frequency evaluation means evaluates that the switch state change frequency of said monitoring-object switch is equal to or greater than the set evaluation reference value without waiting for said evaluation reference time to elapse.

12. The impedance matching device of claim 1, wherein:
said matching calculation unit is configured so as to sample, at a set sampling period, a parameter that reflects an impedance viewed from the output terminal of said high-frequency power source toward the load, and to perform said matching calculation each time said parameter is sampled.

13. The impedance matching device of claim 12, wherein:
said switch state evaluation unit is provided with load-side impedance occurrence frequency detection means for detecting, as a load-side impedance variation occurrence frequency, a number of times that a variation greater than or equal to a set size occurs in said load-side impedance in a set evaluation reference time, and load-side impedance variation occurrence frequency evaluation means for evaluating whether the detected load-side impedance variation occurrence frequency is equal to or greater than a set evaluation reference value, and said switch state evaluation unit is configured so as to evaluate that at least one of the capacitance adjustment switches provided to said matching circuit is in a state requiring suppression of a temperature increase when an evaluation is made by said load-side impedance variation occurrence frequency evaluation means that the load-side impedance variation occurrence frequency is equal to or greater than the set evaluation reference value.

14. The impedance matching device of claim 13, wherein:
said load-side impedance variation occurrence frequency detection means is configured so that each time said matching calculation unit samples the parameter that reflects the impedance viewed from the output terminal of said high-frequency power source toward the load, a difference between a parameter at an immediately preceding sampling thereof and a parameter at a current sampling thereof is detected as a parameter variation amount, a number of times that a parameter variation amount equal to or greater than a set size is detected in said evaluation reference time being designated as said load-side impedance variation occurrence frequency.

15. The impedance matching device of claim 12, wherein:
said switch control unit is configured so as to reduce a frequency of switching operation by said protection-object switch by causing said matching calculation unit to sample said parameter at a period longer than said set sampling period when said temperature increase suppression control is performed.

16. The impedance matching device of claim 1, wherein:
said protection-object switch is at least one capacitance adjustment switch, from among the capacitance adjustment switches provided to said matching circuit, including a switch having a high probability of reaching a state in which suppression of a temperature increase is required when a state of varying load-side impedance is continued.

17. The impedance matching device of claim 1, wherein:
first through $n^{th}$ capacitors and first through $n^{th}$ capacitance adjustment switches connected in series to the first through $n^{th}$ capacitors, respectively, are provided to the variable capacitors provided to said matching circuit;
said matching calculation unit is configured so that first through $n^{th}$ digits of an n-bit binary number, the first digit and $n^{th}$ digit thereof being, respectively, a least significant digit and a most significant digit thereof, are made to correspond respectively to said first through $n^{th}$ capacitors, and the target switch state to be attained by said first through $n^{th}$ capacitance adjustment switches is indicated by whether each of the first through $n^{th}$ digits of the n-bit binary number are 1 or 0; and
said switch state evaluation unit is configured so as to evaluate that at least one of the capacitance adjustment switches provided to said matching circuit is in a state requiring suppression of a temperature increase when a number of times that the n-bit binary number changes in the set evaluation reference time is equal to or greater than a set evaluation reference value.

18. The impedance matching device of claim 1, wherein:
a temperature sensor for detecting a temperature that reflects a temperature of the capacitance adjustment switches provided to said matching circuit is provided; and
said switch state evaluation unit is configured so as to evaluate that at least one of the capacitance adjustment switches provided to said matching circuit is in a state requiring suppression of a temperature increase when the temperature detected by said temperature sensor is equal to or greater than a set evaluation reference value.

19. The impedance matching device of claim 1, wherein:
said switch control unit is configured so that all of the capacitance adjustment switches provided to said matching circuit are designated as said protection-object switches.

20. The impedance matching device of claim 1, characterized in that said matching calculation unit is configured so as to stop said matching calculation for said temperature increase suppression period and resume said matching calculation after said temperature increase suppression period has elapsed.

21. The impedance matching device of claim 1, characterized in that said matching calculation unit is configured so as to perform said matching calculation also during said temperature increase suppression period.

* * * * *